(12) United States Patent
More

(10) Patent No.: US 12,532,494 B2
(45) Date of Patent: Jan. 20, 2026

(54) EPITAXY REGIONS WITH REDUCED LOSS CONTROL

(71) Applicant: Taiwan Semiconductor Manufacturing Co., Ltd., Hsinchu (TW)

(72) Inventor: Shahaji B. More, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 585 days.

(21) Appl. No.: 17/648,010

(22) Filed: Jan. 14, 2022

(65) Prior Publication Data

US 2023/0118638 A1   Apr. 20, 2023

Related U.S. Application Data

(60) Provisional application No. 63/256,179, filed on Oct. 15, 2021.

(51) Int. Cl.
*H10D 30/01* (2025.01)
*H10D 30/62* (2025.01)
(Continued)

(52) U.S. Cl.
CPC ..... *H10D 30/0243* (2025.01); *H10D 30/6211* (2025.01); *H10D 30/6219* (2025.01); *H10D 84/013* (2025.01); *H10D 84/0158* (2025.01); *H10D 84/038* (2025.01); *H10D 84/834* (2025.01)

(58) Field of Classification Search
CPC ........... H01L 29/6681; H01L 29/41791; H01L 29/7851; H01L 21/823418; H01L 21/823431; H01L 27/0886; H10D 30/0243; H10D 30/6211; H10D 84/013; H10D 84/0158; H10D 84/834; H10D 30/6219; H10D 84/038
See application file for complete search history.

(56) References Cited

U.S. PATENT DOCUMENTS 10,840,358 B2    11/2020  More et al.
2019/0097006 A1*  3/2019  Li ................. H01L 29/66795
(Continued)

FOREIGN PATENT DOCUMENTS

TW       201923853 A     6/2019

*Primary Examiner* — Christine A Enad
(74) *Attorney, Agent, or Firm* — Slater Matsil, LLP

(57) ABSTRACT

A method includes forming a protruding semiconductor fin protruding higher than isolation regions, forming a gate stack on a first portion of the protruding semiconductor fin, recessing a second portion of the protruding semiconductor fin to form a recess between fin spacers, and forming an epitaxy region from the recess. The formation of the epitaxy region includes growing a first epitaxy layer having a first doping concentration, and growing a second epitaxy layer over the first epitaxy layer. The second epitaxy layer has a second doping concentration higher than the first doping concentration. The method further includes forming an inter-layer dielectric over the epitaxy region, and recessing the inter-layer dielectric to form a contact opening. After the recessing, the first epitaxy layer is separated from the contact opening by a remaining portion of the second epitaxy layer.

20 Claims, 23 Drawing Sheets

(51) Int. Cl.
*H10D 84/01* (2025.01)
*H10D 84/03* (2025.01)
*H10D 84/83* (2025.01)

(56) References Cited

U.S. PATENT DOCUMENTS

| | | | |
|---|---|---|---|
| 2019/0148527 A1* | 5/2019 | More | H01L 21/26513 |
| | | | 257/401 |
| 2019/0165143 A1* | 5/2019 | More | H01L 29/66492 |
| 2020/0119010 A1* | 4/2020 | Lee | H01L 21/823481 |

* cited by examiner

EPITAXY REGIONS WITH REDUCED LOSS CONTROL

PRIORITY CLAIM AND CROSS-REFERENCE

This application claims the benefit of the following provisionally filed U.S. Patent Application No. 63/256,179, filed on Oct. 15, 2021, and entitled "EPI Loss Control for Device Boost," which application is hereby incorporated herein by reference.

BACKGROUND

In the formation of Fin Field-Effect Transistors, source/drain regions were typically formed by forming semiconductor fins, recessing semiconductor fins to form recesses, and growing epitaxy regions starting from the recesses. The epitaxy regions grown from the recesses of neighboring semiconductor fins may merge with each other, and the resulting epitaxy regions may have planar top surfaces. Source/drain contact plugs are formed to electrically connect to the source/drain regions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
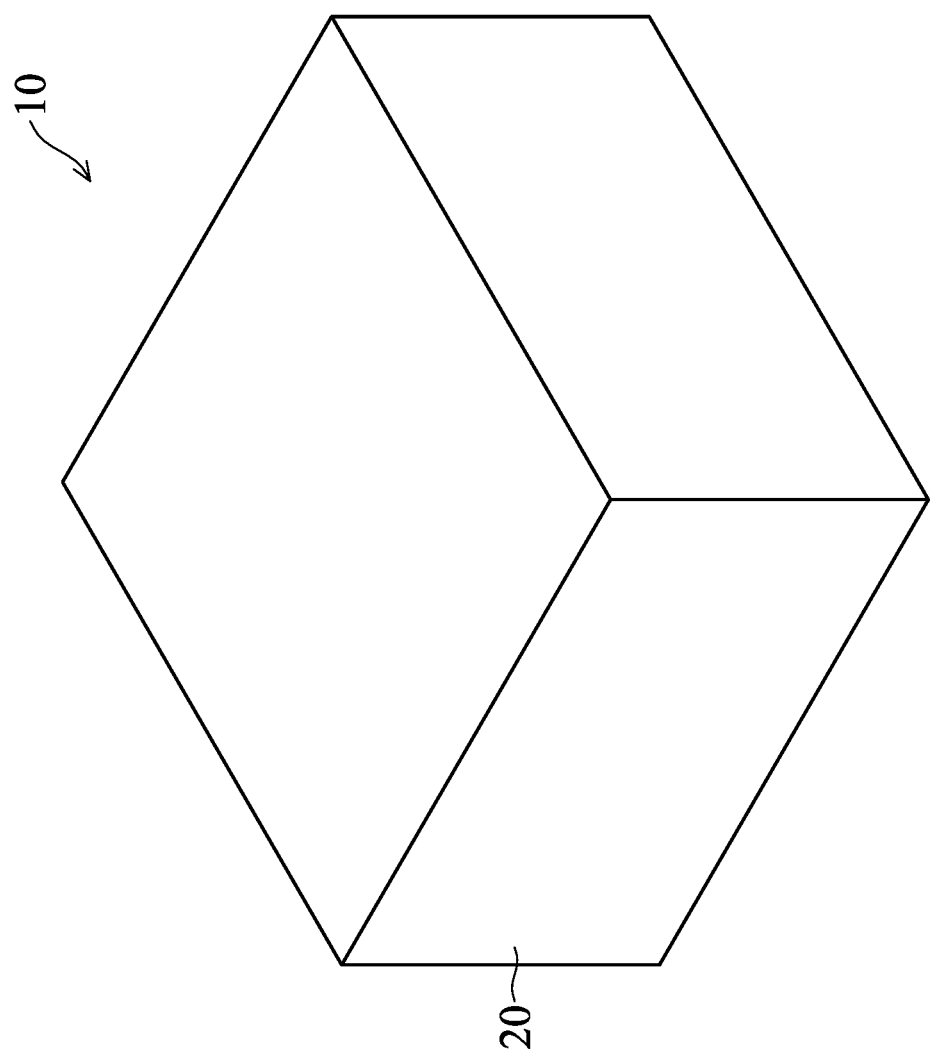
FIGS. 1-5, 6A, 6B, 7A, 7B, 8A, 8B, and 9-13 illustrate the cross-sectional views of intermediate stages in the formation of a Fin Field-Effect Transistor (FinFET) based on a single protruding semiconductor fin in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Fin Field-Effect Transistor (FinFET) and the method of forming the same are provided. In accordance with some embodiments of the present disclosure, the FinFET includes a source/drain region, which is formed through epitaxially growing a plurality of semiconductor layers with different compositions. The plurality of semiconductor layers include a high-doped layer on a low-doped layer. The high-doped layer has the function of stopping etching in the formation of contact opening, so that in the final structure, it may separate the resulting source/drain silicide region from the low-doped semiconductor layer. This prevents the undesirable fast etching of the low-doped semiconductor layer, and may reduce dopant loss and improve strain. Although FinFETs are provided as examples, the embodiments of the present disclosure may be applied on other types of transistors such as Gate-All-Around (GAA) transistors, planar transistors, or the like. The Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 20:
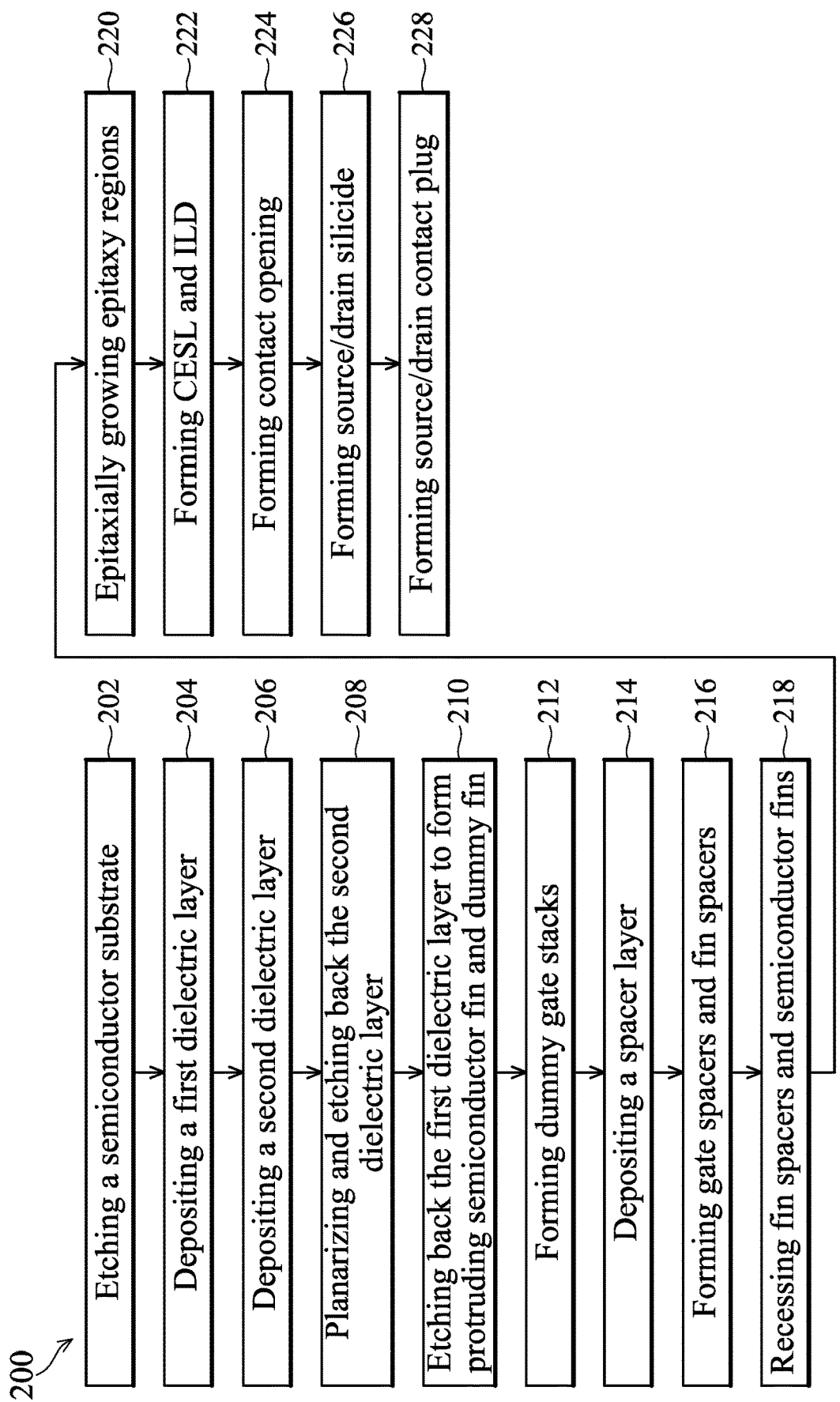
FIG. 20 illustrates a process flow for forming a FinFET in accordance with some embodiments.

FIGS. 1-5, 6A, 6B, 7A, 7B, 8A, 8B, and 9-13 illustrate the cross-sectional views of intermediate stages in the formation of FinFETs including dummy dielectric fins in accordance with some embodiments of the present disclosure. The corresponding processes are also reflected schematically in the process flow 200 as shown in FIG. 20.

Referring to FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of semiconductor substrate 20 may include silicon; germanium; a compound semiconductor including carbon-doped silicon, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Substrate 20 may be a bulk substrate or may have a silicon-on-insulator structure.

Figure 2:
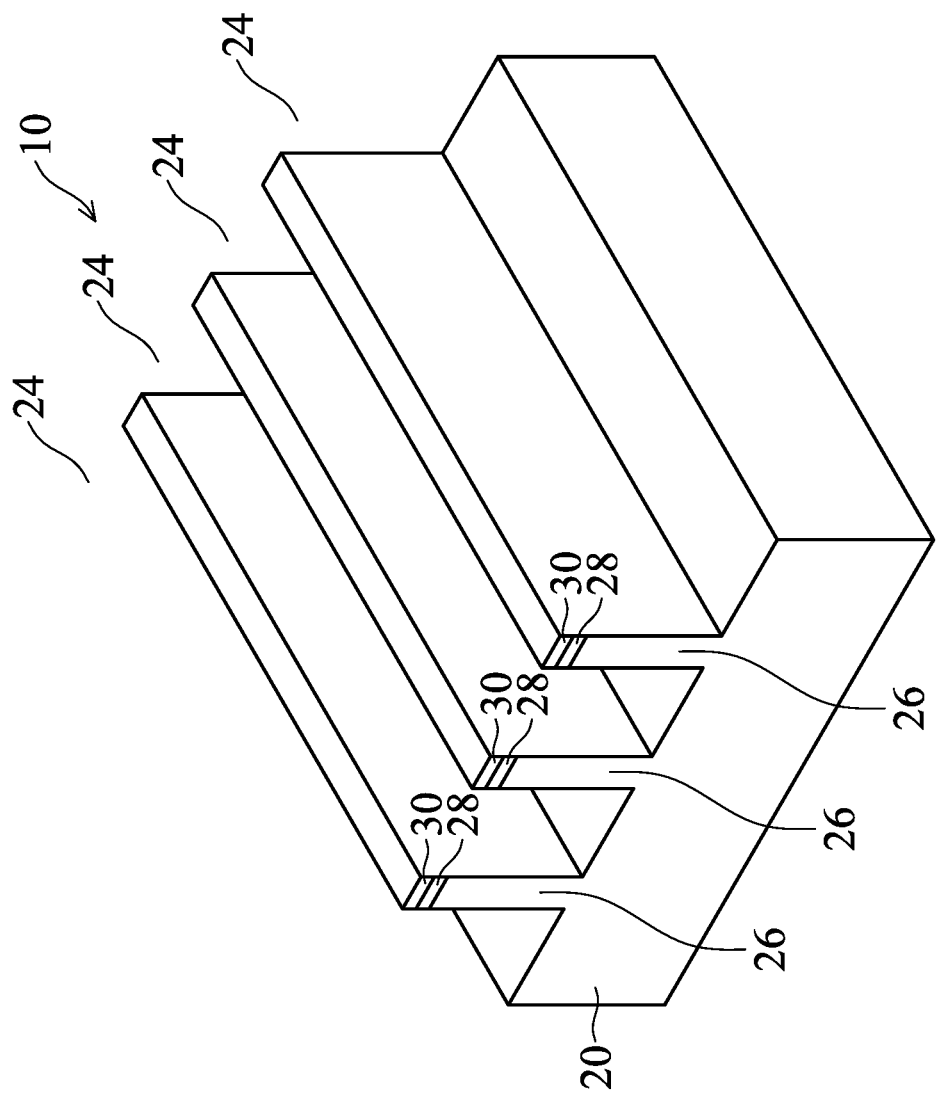

FIGS. 2-5, 6A, and 6B illustrate the formation of Shallow Trench Isolation STI) regions, protruding semiconductor fins, and dummy dielectric fins (also referred to as dielectric fins) in accordance with some embodiments. It is appreciated that the formation process shown in these figures is an example, and different processes may be used. Referring to FIG. 2, substrate 20 is etched to form trenches 24. The respective process is illustrated as process 202 in the process flow 200 as shown in FIG. 20. The portions of substrate 20 between neighboring trenches 24 are referred to as semiconductor strips 26. To form trenches 24, pad oxide layer 28 and hard mask layer 30 are formed on semiconductor substrate 20, and are then patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized.

In accordance with some embodiments of the present disclosure, hard mask layer 30 is formed of or comprises silicon nitride, for example, using Low-Pressure Chemical Vapor Deposition (LPCVD), Plasma Enhanced Chemical Vapor Deposition (PECVD), Atomic Layer Deposition (ALD), or the like. A photoresist (not shown) is formed on hard mask layer 30 and is then patterned. Hard mask layer 30 is then patterned using the patterned photoresist as an etching mask to form hard masks 30 as shown in FIG. 2. Next, the patterned hard mask layer 30 is used as an etching mask to etch pad oxide layer 28 and substrate 20, forming trenches 24.

Figure 3:
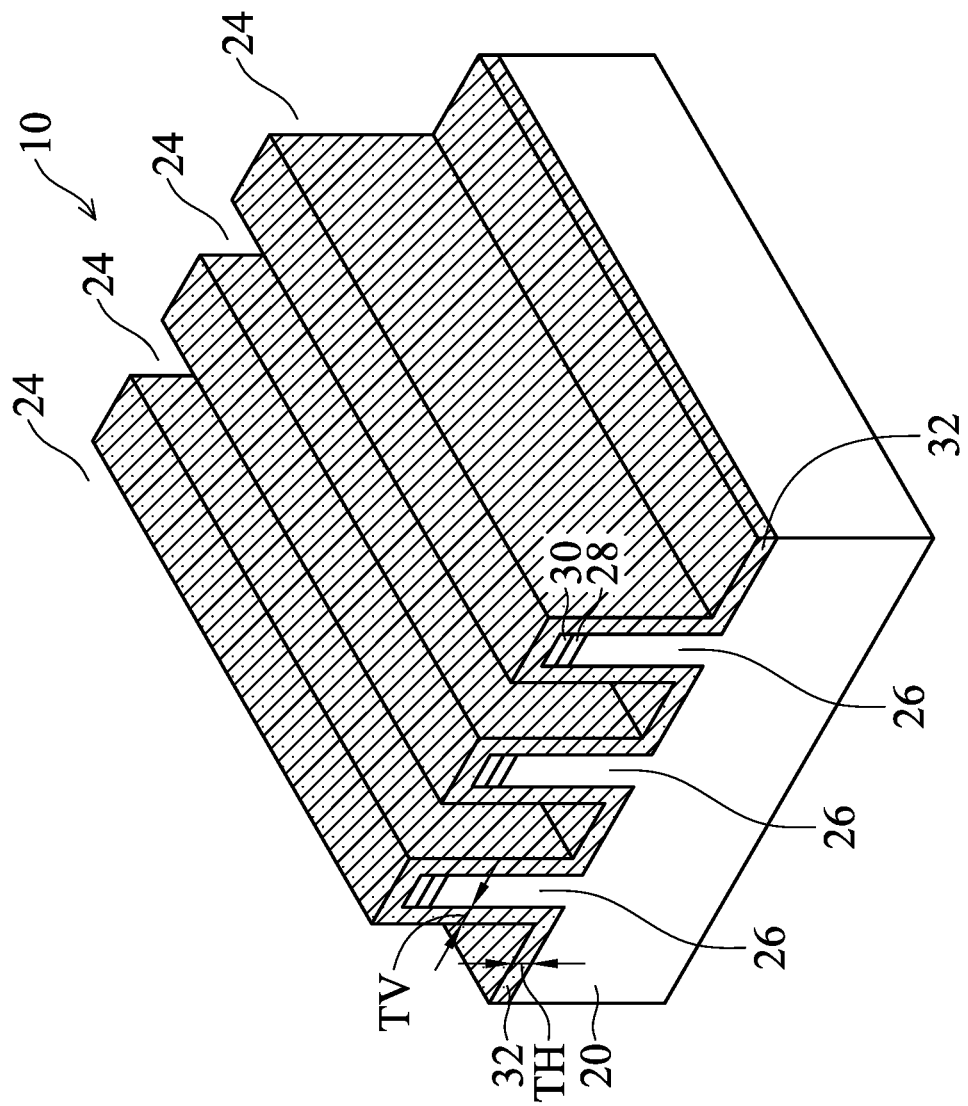

Referring to FIG. 3, dielectric layer 32 is deposited. The respective process is illustrated as process 204 in the process flow 200 as shown in FIG. 20. In accordance with some embodiments of the present disclosure, dielectric layer 32 is formed using a conformal deposition process such as ALD, Chemical Vapor Deposition (CVD), or the like. Accordingly, the thickness TH of the horizontal portions and thickness TV of the vertical portions of dielectric layer 32 are equal to or substantially equal to each other, for example, with a variation smaller than about 10 percent. The material of dielectric layer 32 may be selected from silicon oxide, silicon nitride, silicon oxynitride, silicon oxy-carbo-nitride, hafnium oxide, zirconium oxide, aluminum oxide, and the like, or multi-layers thereof. Thickness TV (and TH) may be comparable with the width of trenches 24, for example, with a ratio of TV to the width of trenches 24 being in the range between about 0.3 and about 3.

Figure 4:
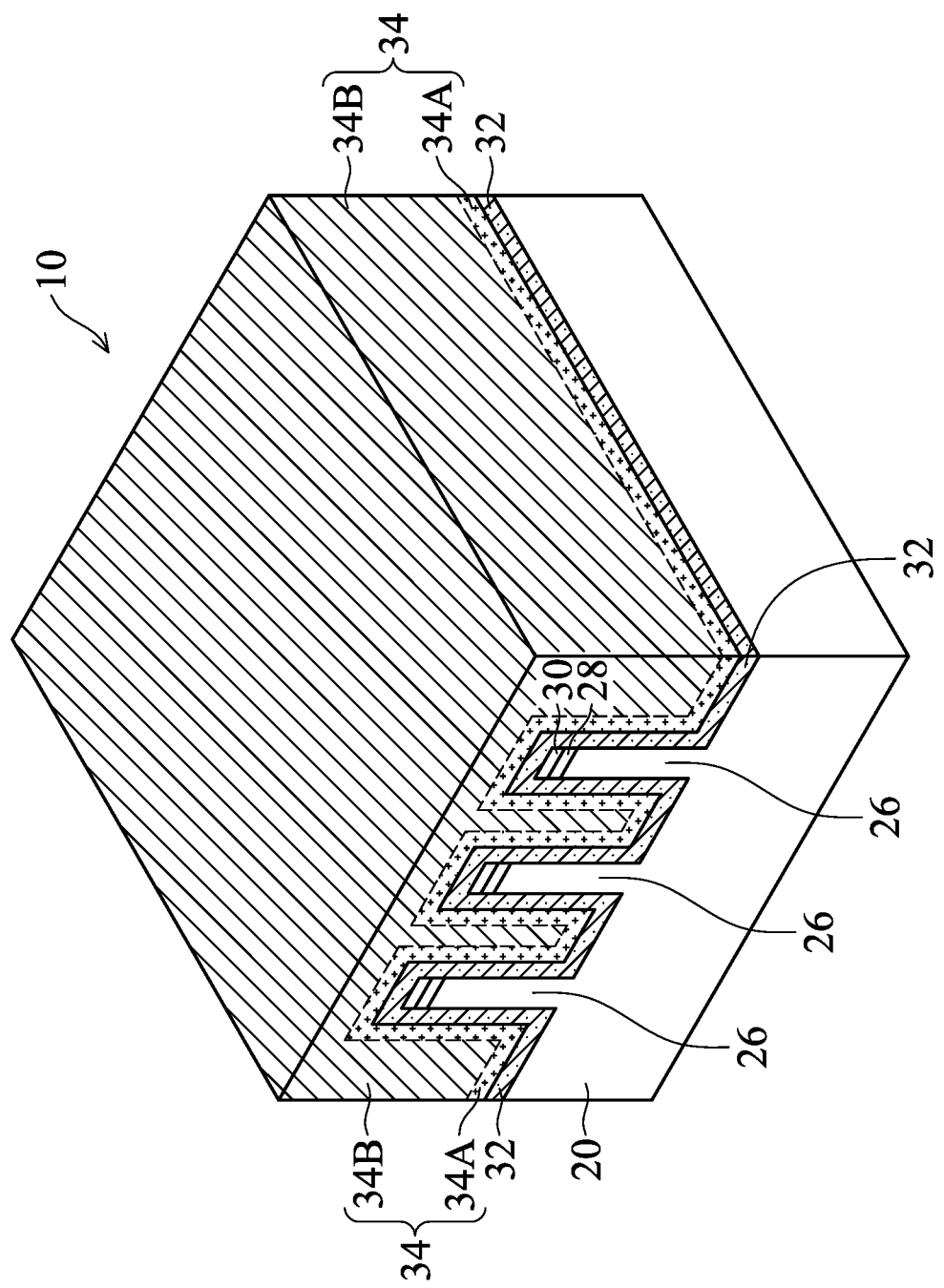

Referring to FIG. 4, dielectric layer 34 is deposited. The respective process is illustrated as process 206 in the process flow 200 as shown in FIG. 20. Dielectric layer 34 may be a single layer, or may be a composite layer including a plurality of sub layers. In accordance with some embodiments, dielectric layer 34 is deposited using Flowable Chemical Vapor Deposition (FCVD), spin-on coating, or the like. In accordance with alternative embodiments, Atomic Layer Deposition (ALD), High-Density Plasma Chemical Vapor Deposition (HDPCVD), CVD, Plasma Enhanced Chemical Vapor Deposition (PECVD) or the like may be used. In accordance with some embodiments, dielectric layer 34 is formed of or comprises silicon oxide, silicon nitride, silicon oxynitride, silicon oxy carbo-nitride, or a high-k dielectric material such as hafnium oxide, zirconium oxide, aluminum oxide, aluminum nitride, titanium nitride, or the like, combinations thereof, or multi-layers thereof. An anneal/curing process may be performed to improve the quality of dielectric layers 32 and 34.

In accordance with some embodiments, dielectric layer 34 includes dielectric layer 34A and dielectric layer 34B over dielectric layer 34A. For example, dielectric layer 34A may be a silicon oxide layer, and dielectric layer 34B may be a silicon nitride layer or another high-k dielectric layer formed of a material as aforementioned.

Figure 5:
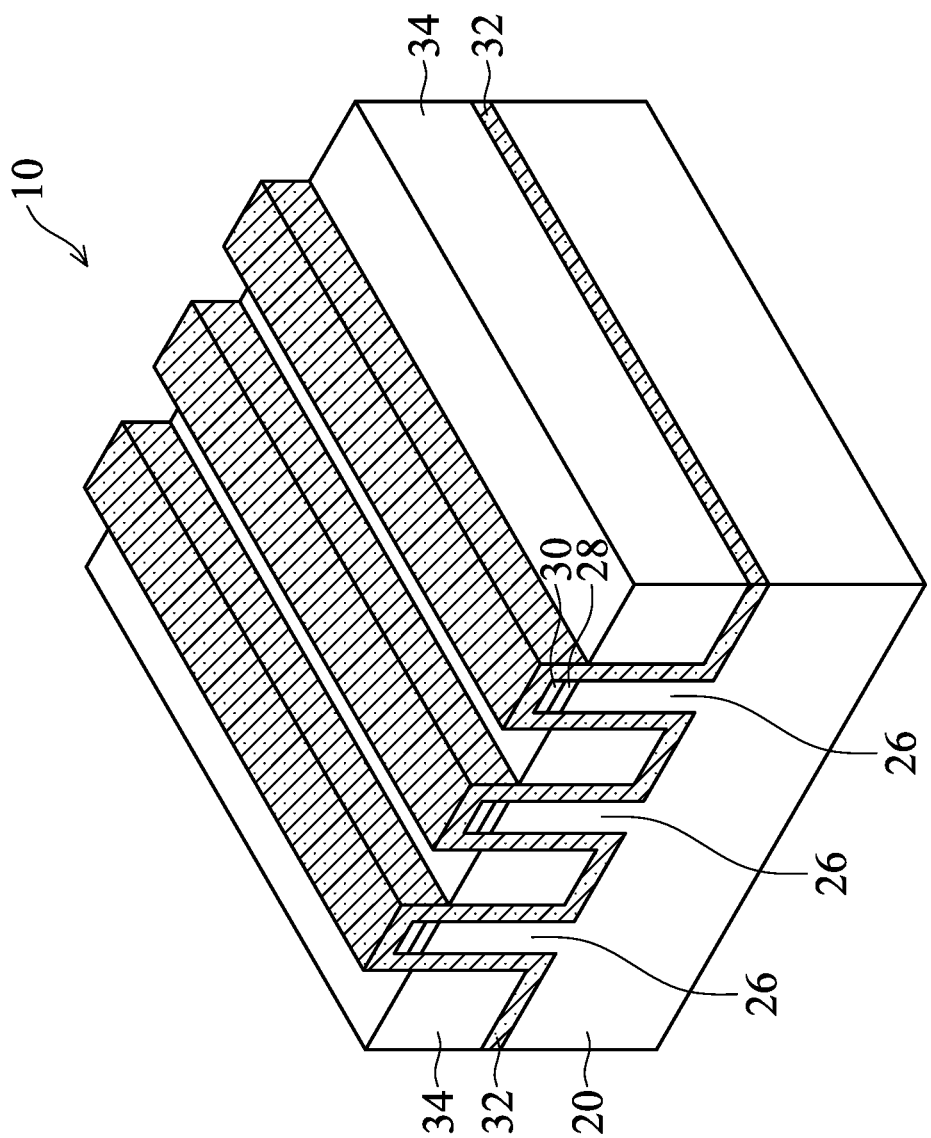

In a subsequent process, as shown in FIG. 5, a planarization process such as a Chemical Mechanical Polish (CMP) process or a mechanical grinding process may be performed to planarize the top surface of dielectric layer 34. An etch-back process is then performed to etch back dielectric layer 34 to a desirable height. Accordingly, dielectric layer 34 is recessed. The respective process is illustrated as process 208 in the process flow 200 as shown in FIG. 20.

Figure 6A:
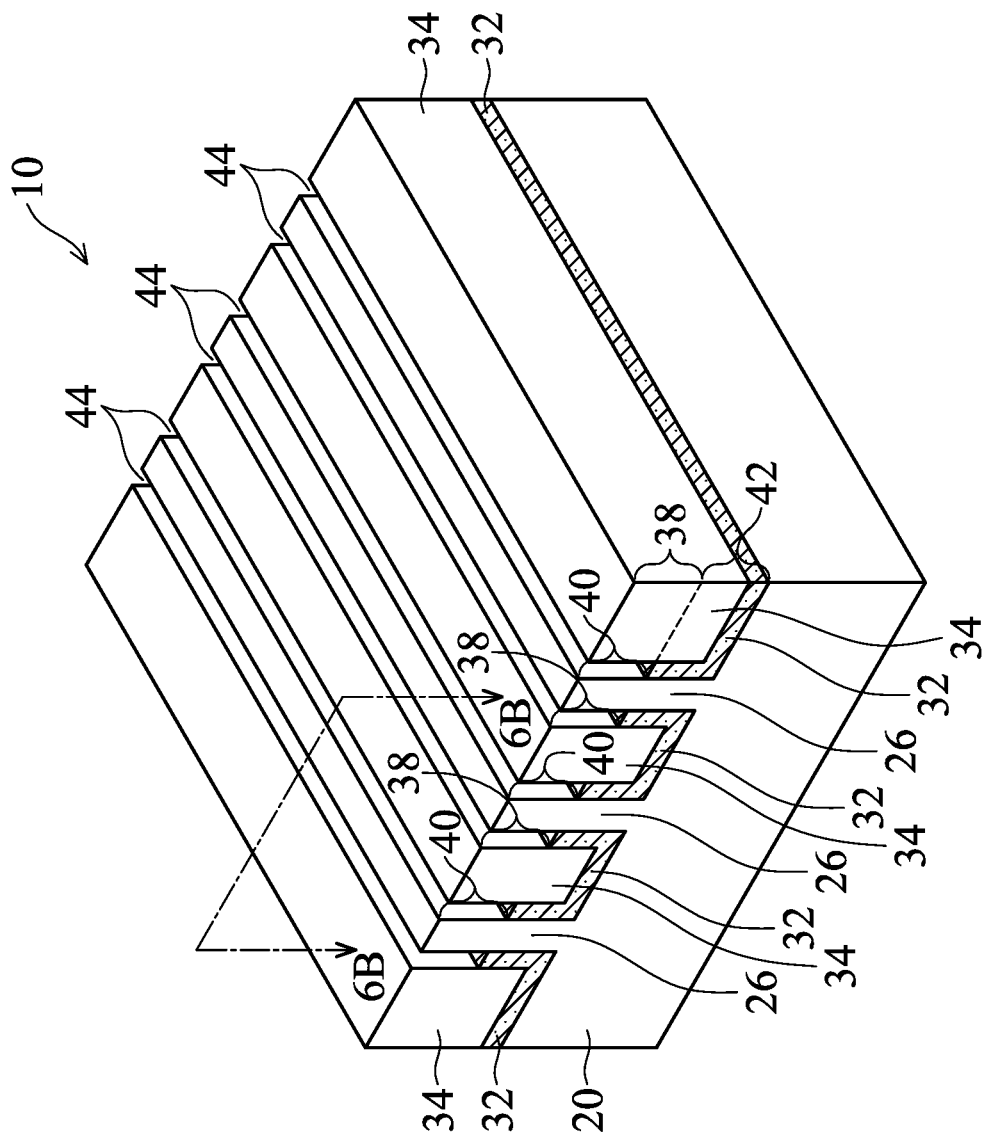
Figure 6B:
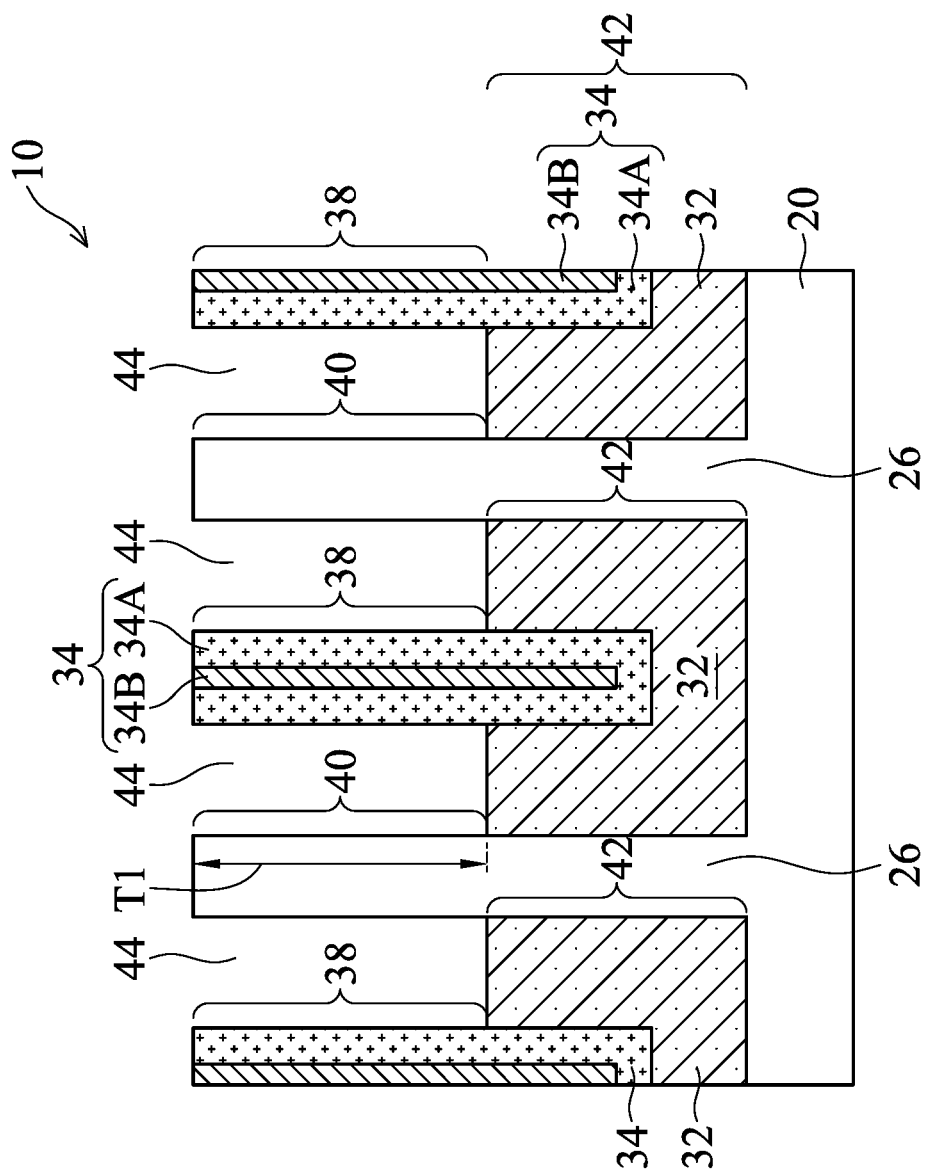

FIGS. 6A and 6B illustrate the recessing of dielectric layer 32. The respective process is illustrated as process 210 in the process flow 200 as shown in FIG. 20. The recessing may be performed using an isotropic etching process (such as a wet etching process or a dry etching process) or an anisotropic etching process (such as a dry etching process). The etching chemical (etching solution or etching gas) is selected so that dielectric layer 32 is etched, while dielectric layer 34 is not etched.

As a result of the recessing of dielectric layer 32, some portions of dielectric layer 34 protrude higher than the top surfaces of the remaining dielectric layer 32 to form dielectric fins 38. Furthermore, semiconductor strips 26 have some top portions protruding higher than the top surfaces of the remaining dielectric layer 32 to form protruding semiconductor fins 40. Throughout the description, the portions of dielectric layer 32 and dielectric layer 34 below protruding semiconductor fins 40 are collectively referred to as Shallow Trench Isolation (STI) regions 42. Hard mask layer 30 and pad oxide layer 28 (FIG. 5) may also be removed.

FIG. 6B illustrates the cross-section 6B-6B in FIG. 6A, wherein the cross-section is obtained from a vertical plane. In the cross-section, dielectric layer 32 has a bottom portion underlying dielectric layer 34, and sidewall portions over and connected to the opposite ends of the bottom portion. Protruding semiconductor fins 40 and dielectric fins 38 are separated from each other by trenches 44, which are left by the recessed dielectric layer 32. In accordance with some embodiments of the present disclosure, height T1 of protruding semiconductor fins 40 may be in the range between about 40 nm and about 80 nm, while different heights may be adopted.

Figure 7A:
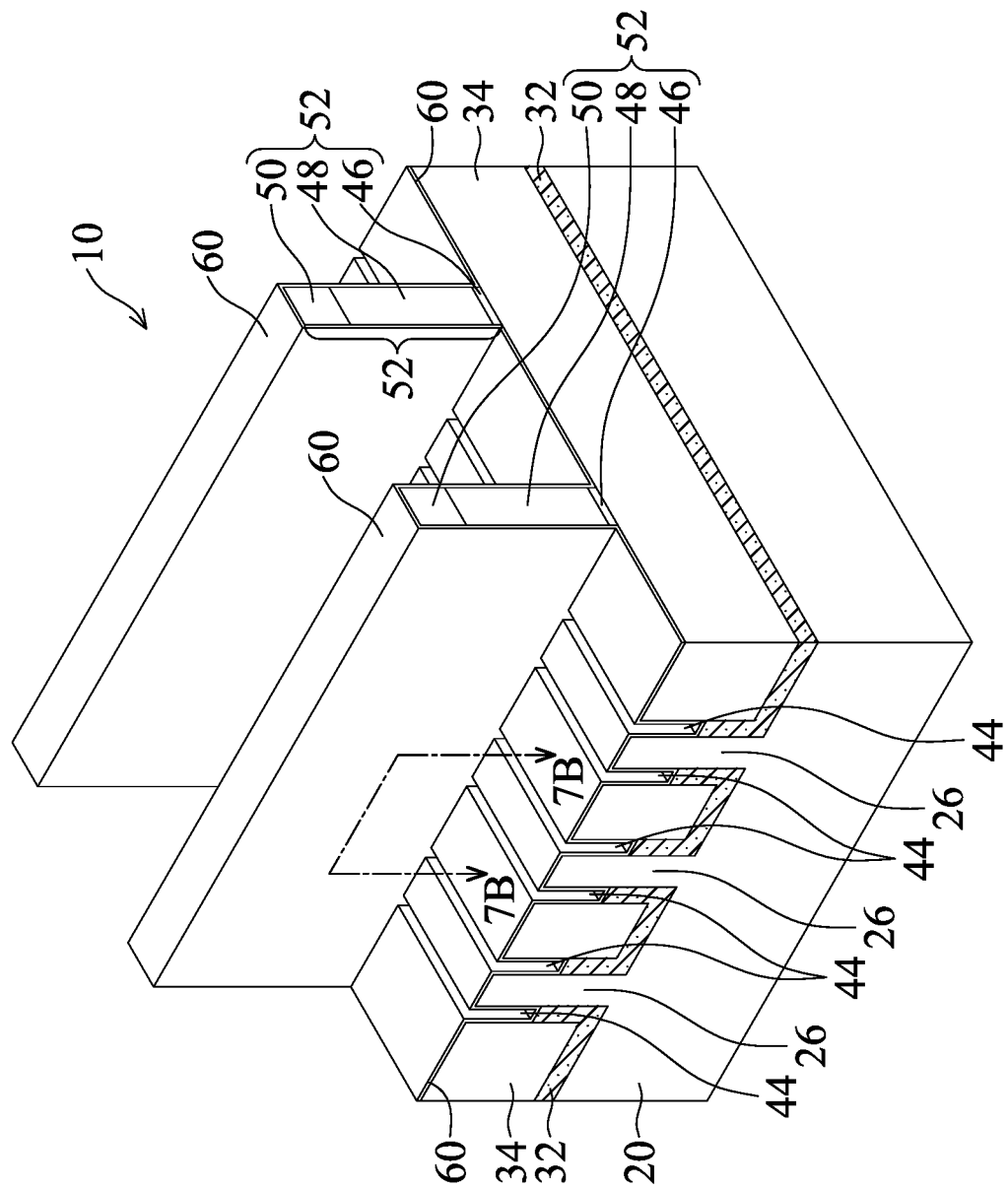

Referring to FIG. 7A, dummy gate stacks 52 are formed to extend on the top surfaces and the sidewalls of protruding semiconductor fins 40 and dielectric fins 38, and extend into trenches 44. The respective process is illustrated as process 212 in the process flow 200 as shown in FIG. 20. Dummy gate stacks 52 may include dummy gate dielectrics 46 and dummy gate electrodes 48 over dummy gate dielectrics 46. Dummy gate dielectrics 46 may be formed of or comprise silicon oxide, and dummy gate electrodes 48 may be formed of or comprise amorphous silicon or polysilicon, while other applicable materials may also be used. Each of dummy gate stacks 52 may also include one (or a plurality of) hard mask layer 50 over dummy gate electrodes 48. Hard mask layers 50 may be formed of silicon nitride, silicon oxide, silicon carbo-nitride, silicon oxy-carbo-nitride, or multi-layers thereof. Dummy gate stacks 52 may cross over one or a plurality of protruding semiconductor fins 40 and one or a plurality of dielectric fins 38. Dummy gate stacks 52 also have lengthwise directions perpendicular to the lengthwise directions of protruding semiconductor fins 40 and dielectric fins 38.

The formation of dummy gate stacks 52 may include depositing a conformal gate dielectric layer, depositing a dummy gate electrode layer to fully fill the trenches 44 (FIG. 6B), planarizing the top surface of dummy gate electrode layer, depositing hard mask layers on the planarized dummy gate electrode layer, and patterning the deposited layers.

After the formation of the dummy gate stacks 52, dielectric spacer layer 60 is deposited as a conformal layer. The respective process is illustrated as process 214 in the process flow 200 as shown in FIG. 20. In accordance with some embodiments, dielectric spacer layer 60 is formed of or comprises one or more dielectric material(s), which may comprise silicon oxide, silicon nitride, silicon oxynitride, silicon oxy-carbo-nitride, or the like, combinations thereof, and/or composite layers thereof.

Figure 7B:
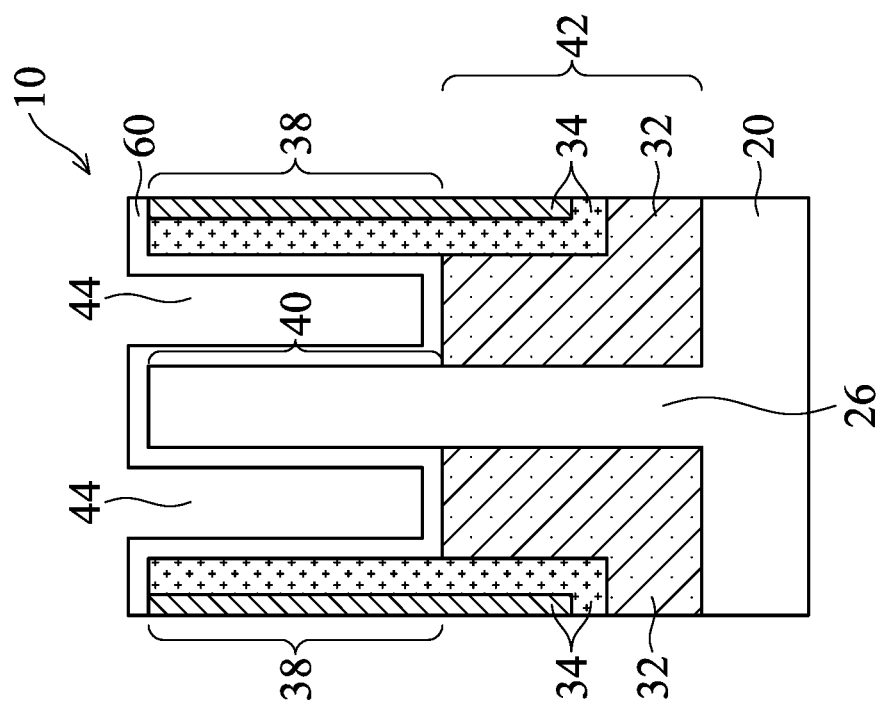

FIG. 7B illustrates the cross-section 7B-7B in FIG. 7A, wherein the cross-section is obtained in a vertical plane. As shown in FIG. 7B, spacer layer 60 may extend into the trenches 44 between protruding semiconductor fins 40 and their corresponding neighboring dielectric fins 38.

Figure 8A:
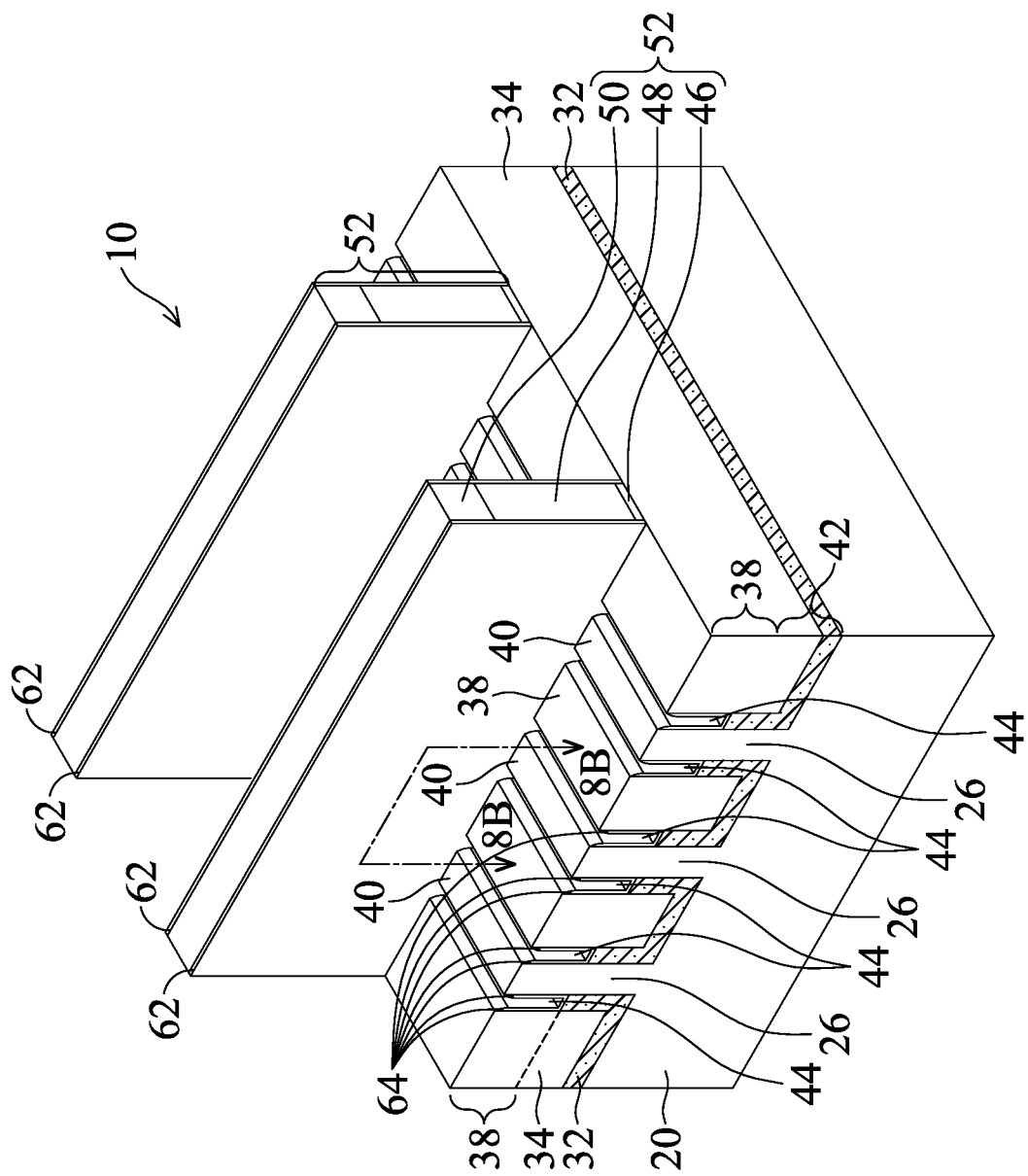
Figure 8B:
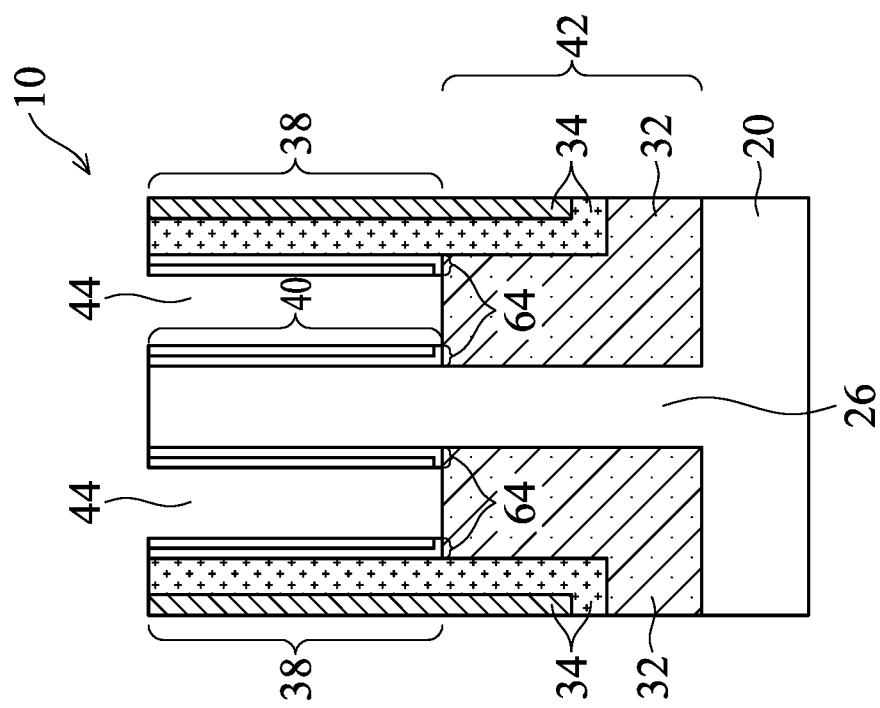

FIGS. 8A and 8B illustrate a perspective view and a cross-sectional view, respectively, in the etching of dielectric spacer layer 60 to form gate spacers 62 and fin spacers 64. The respective process is illustrated as process 216 in the process flow 200 as shown in FIG. 20. FIG. 8B illustrates the vertical cross-section 8B-8B in FIG. 8A. The etching is performed through one or a plurality of anisotropic etching processes, depending on the structure, the sub-layers (if any), and the materials of dielectric spacer layer 60. As a result of the etching, the top portions of dielectric spacer layer 60 on top surfaces of dummy gate stacks 52, protruding semiconductor fins 40, and dielectric fins 38 are removed. Gate spacers 62 are thus formed on the sidewalls of dummy gate stacks 52, and fin spacers 64 are formed on the sidewalls of protruding semiconductor fins 40 and dielectric fins 38. The horizontal portions of the spacer layer 60 contacting the top surfaces of dielectric layer 32 may be fully removed, or may be thinned, but still have thin portions remaining.

Figure 9:
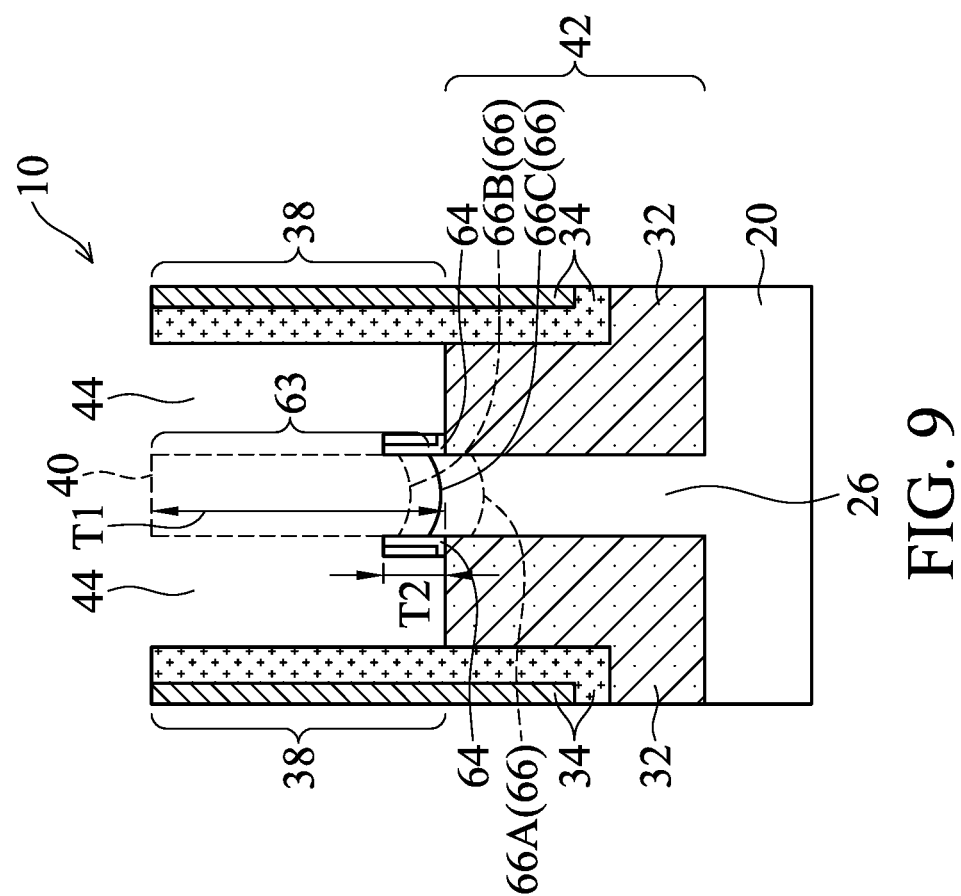

An etching process is then performed to etch the portions of protruding semiconductor fins 40 that are not covered by dummy gate stacks 52 and gate spacer 62 (FIG. 8A), resulting in the recess 63 as shown in FIG. 9. The respective process is illustrated as process 218 in the process flow 200 as shown in FIG. 20. FIG. 9 illustrates the cross-section same as the cross-section of FIG. 8B. In FIG. 9, dashed lines are used to represent the portion of protruding semiconductor fin 40 that is protected by dummy gate stacks 52 and gate spacers 62. The protruding semiconductor fin 40 is not in the illustrated plane, and hence is shown as being dashed.

The recessing may be anisotropic, and the portions of protruding semiconductor fins 40 directly underlying dummy gate stacks 52 and gate spacers 62 are protected from being etched. The top surfaces of the recessed semiconductor fins 40 (or semiconductor strips 26) may be high than, level with, or lower than the top surfaces of STI regions 42. For example, dashed lines 66A and 66B and solid top surface 66C illustrate the possible positions of the top surfaces 66 of the remaining protruding semiconductor fins 40 (or semiconductor strips 26). In accordance with some embodiments of the present disclosure, the recessing of protruding semiconductor fins 40 is performed through a dry etching process. The dry etching may be performed using process gases such as $C_2F_6$, $CF_4$, $SO_2$, the mixture of HF and ozone (followed by diluted HF), the mixture of HBr, $Cl_2$, and $O_2$, the mixture of HBr, $Cl_2$, $O_2$, and $CF_2$, or the like. The etching may be anisotropic or isotropic.

In the recessing process, gate spacers 62, and fin spacers 64 are also recessed. The fin spacers 64 on STI regions 42 still have some portions remaining. The heights T2 of the remaining fin spacers 64 is related to the height T1 of protruding semiconductor fins 40, and the greater the height T1 is, the greater the height T2 of the fin spacers 64 will be, and vice versa.

Furthermore, the greater the height T2 is, the less protruding semiconductor fins 40 is recessed, and the higher the top surface 66 will be, and vice versa. It is appreciated that if fin spacers 64 are too high, the subsequently formed epitaxy region will be too small. If fin spacers 64 are too short, the subsequently formed epitaxy region will be too large and too wide. The height T2 may be selected to be in the range between about 5 nm and about 30 nm in accordance with some embodiments.

Figure 10:
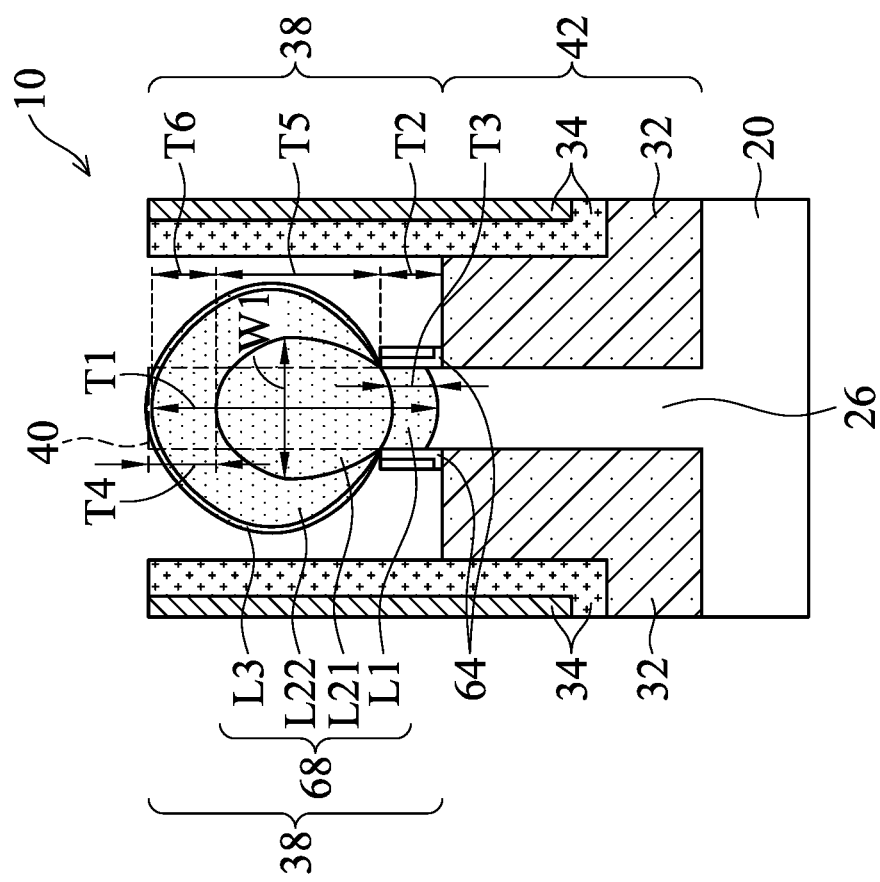

Next, epitaxy regions (source/drain regions) 68 are formed by selectively growing (through epitaxy) a plurality of semiconductor layers, resulting in the structure in FIG. 10, which shows one of the epitaxy regions 68. The respective process is illustrated as process 220 in the process flow 200 as shown in FIG. 20. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), silicon boron (SiB), or the like may be grown. Conversely, when the resulting FinFET is an n-type FinFET, silicon phosphorous (SiP), silicon carbon phosphorous (SiCP), or the like may be grown. In the epitaxy process, dielectric fins 38 are used to limit the lateral growth of epitaxy source/drain regions 68, and prevent neighboring source/drain regions 68 from merging with each other. In subsequent discussion, the p-type source/drain regions of a p-type FinFET is used as an example. The concept of the embodiments may also be applied to the formation process and the structure of n-type source/drain regions.

Epitaxy region(s) 68 may include epitaxy layers L1, L21, and L22 in accordance with some embodiments. Epitaxy layer L3 (also referred to as a capping layer) may be, or may not be formed on epitaxy layer L22. Accordingly, epitaxy layer L3 is illustrated using dashed lines to indicate it may or may not be formed. Epitaxy layers L1, L21, L22, and L3 are formed through selective epitaxy processes. The deposition of epitaxy layers L1, L21, L22, and L3 may be performed using Remote Plasma Chemical Vapor Deposition (RPCVD), Plasma Enhanced Chemical Vapor Deposition (PECVD), or the like. The tops of epitaxy regions 68 may be level with the tops of protruding fins 40 and/or dielectric fins 38. The tops of epitaxy regions 68 may also be slightly higher than or lower than (for example, with a height difference smaller than about 10 nm or 5 nm) the tops of protruding semiconductor fins 40 and/or dielectric fins 38.

In accordance with some embodiments, epitaxy layers L1, L21, L22, and L3 are formed of or comprise SiGeB. The process gas for their formation may include a silicon-containing gas such as silane, disilane ($Si_2H6$) dicholorosilane (DCS), or the like, a germanium-containing gas such as germane ($GeH_4$), digermane ($Ge_2H6$), or the like, and a dopant-containing process gas such as $B_2H6$ or the like. The compositions of each of epitaxy layers L1, L21, L22, and L3 are different from its immediately neighboring epitaxy layer(s), so that they can be distinguished from each other. In accordance with some embodiments, epitaxy layer L21 has a boron concentration higher than the boron concentration of epitaxy layer L1, and/or a germanium atomic percentage higher than the germanium atomic percentage of epitaxy layer L1. Epitaxy layer L22 may have a boron concentration equal to or higher than the boron concentration of epitaxy layer L21, and/or a germanium atomic percentage higher than the germanium atomic percentage of epitaxy layer L21. Epitaxy layer L3 may have a boron concentration equal to or higher than the boron concentration of epitaxy layer L22. Epitaxy layer L3 may also be formed of silicon germanium, and may have a germanium atomic percentage equal to or lower than the germanium atomic percentage of epitaxy layer L22. Alternatively, epitaxy layer L3 may be formed of silicon (with no boron and germanium therein) or SiB (with no germanium therein), and may have a boron concentration equal to or higher than the boron concentration of epitaxy layer L22.

The process for forming each of epitaxy layers L1, L21, and L22 may include an etch-back process after the corresponding deposition. The etching-back process may be performed with an etching gas (such as HCl), and may or may not include a silicon-containing gas such as $SiH_4$. The etching back results in and improves the formation of (111) facets, and helps to shape epitaxy region 68 and removes residual gases in the respective deposition chamber in order to reduce defect.

In accordance with some embodiments, the deposition of epitaxy layer L1 is performed through non-conformal deposition processes (which may be bottom-up processes), so that the bottom portion of epitaxy layer L1 is thicker than the sidewall portions. In accordance with some embodiments, epitaxy layer L1 is deposited until its top surface is level with or lower than the top ends of fin spacers 64. Epitaxy layer L1 may also include a multi-layer structure including, for example, a SiGe layer (without being doped with boron) and a SiGeB layer over the SiGe layer. Epitaxy layer L1 may have a boron concentration in the range between about $1 \times 10^{20}/cm^3$ and about $8 \times 10^{20}/cm^3$. The germanium atomic percentage may be in the range between about 15 percent and about 30 percent. Epitaxy layer L1 may have a uniform germanium atomic percentage in accordance with some embodiments. In accordance with alternative embodiments, epitaxy layer L1 may have a gradient germanium atomic percentage, with the upper portions having higher germanium atomic percentages than the respective lower portions. For example, the bottom portion of epitaxy layer L1 may have the germanium atomic percentage equal to or lower than about 15 percent, and with the proceeding of the epitaxy of epitaxy layer L1, the germanium atomic percentage may gradually and continuously increase, with the germanium atomic percentage in the top portion of epitaxy layer L1 being equal to about 30 percent. The thickness T3 of epitaxy layer L1 may be in the range between about 5 nm and about 15 nm, depending on the position of the bottom of recess 63 (FIG. 9).

Epitaxy layer L21 may have a boron concentration higher than the boron concentration in epitaxy layer L1. For example, the boron concentration in epitaxy layer L21 may be in the range between about $8 \times 10^{20}/cm^3$ and about $1 \times 10^{21}/cm^3$ in accordance with some embodiments. Furthermore, the germanium atomic percentage in epitaxy layer L21 is higher than the germanium atomic percentage in epitaxy layers L1. For example, the germanium atomic percentage in epitaxy layer L21 may be in the range between about 40 percent and about 60 percent in accordance with some embodiments.

The top ends of epitaxy layer L21 are lower than the top ends of protruding semiconductor fins 40 (and/or the top ends of dielectric fins 38) by distance T4. Distance T4 is designed to be great enough to allow enough space for growing epitaxy layer L22 thereon (with epitaxy region 68 not exceeding the top end of protruding semiconductor fins 40 substantially), and not too small to allow for a large enough L21. If distance T4 is too large, the shape of epitaxy region 68 will be abnormal. If the value of distance T4 is too small, the overlaying epitaxy layer L22 will be too thin, and may be etched-through in subsequent contact opening formation, causing boron loss. In accordance with some embodiments, distance T4 is selected to be in the range between about 8 nm and about 20 nm.

Figure 12:
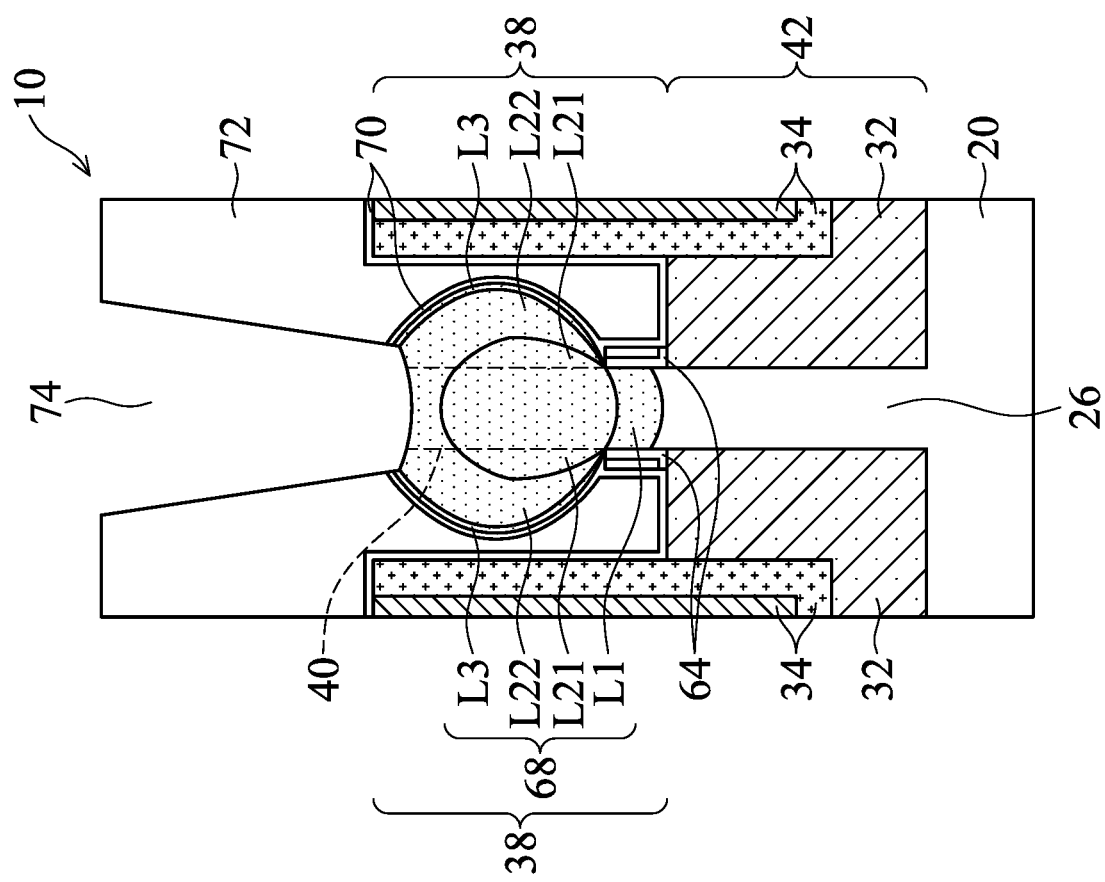

Furthermore, the value of height T5 of epitaxy layer L21 cannot be too small or too high. If height T5 is too small, the shape of epitaxy region 68 will be abnormal. If the value of height T5 is too high, the overlaying epitaxy layer L22 will be too thin, and may be etched-through in subsequent contact opening formation (FIG. 12). This will result in boron loss in epitaxy layer L21. In accordance with some embodiments, height T5 is selected to be in the range between about 15 nm and about 35 nm.

In accordance with some embodiment, to ensure epitaxy region 68 to have a normal shape so that it may generate enough strain, epitaxy layer L21 may be wide enough, but not too wide. For example, ratio W1/T4 may be in the range between about 1 and about 3, wherein W1 is the width of epitaxy region 68. Also, ratio T5/T4 may be in the range between about 1 and about 4. Otherwise, if ratio W1/T4 and/or ratio T5/T4 are smaller than about 1, epitaxy layer L21 will be too small. If ratio W1/T4 is greater than about 1 and/or ratio T5/T4 is greater than about 4, epitaxy layer L21 will be too tall, causing the boron loss issue.

Epitaxy layer L22 is deposited over epitaxy layer L21, and may have a diamond-shape in a cross-sectional view. In accordance with some embodiments, the boron concentration BC22 in epitaxy layer L22 is equal to or higher than the boron concentration BC21 in epitaxy layer L21.

For example, the boron concentration BC22 in epitaxy layer L22 may be in the range between about $8 \times 1020/cm^3$ and about $3 \times 1021/cm^3$. The ratio BC22/BC21 may be in the range between about 1 and about 3. Furthermore, the germanium atomic percentage in epitaxy layer L22 is higher than the germanium atomic percentage in epitaxy layers L21, for example, with a difference in the range between about 15 percent and about 30 percent. The germanium atomic percentage in epitaxy layers L22 may be in the range between about 45 percent and about 60 percent in accordance with some embodiments.

In accordance with some embodiments, epitaxy layer L22 has a uniform boron concentration and/or a uniform germanium atomic percentage at the time it is deposited. In accordance with alternative embodiments, epitaxy layer L22 has a non-uniform boron concentration and/or a uniform germanium atomic percentage at the time it is deposited. For example, epitaxy layer L22 may have a lower sub-layer and an upper sub-layer, wherein the lower sub-layer has a greater boron concentration and/or a greater germanium atomic percentage than the upper sub-layer. As will be discussed in subsequent paragraphs, the SiGeB layers having greater boron concentration and greater germanium atomic percentage have lower etching rate in subsequent formation of contact opening. Accordingly, the lower sub-layer may act as an etch stop layer if the upper sub layer is etched-through. In accordance with some embodiments, the ratio of the boron concentration in the lower sub-layer to the boron concentration in the upper sub-layer may be greater than 2, and may be in the range between about 5 and about 10. The difference of the germanium atomic percentage in the lower sub-layer and the germanium atomic percentage in the upper sub-layer may be greater than about 5 percent, and may be in the range between about 5 percent and about 10 percent. The epitaxy layer L22 may also have a gradient boron concentration and/or a gradient germanium atomic percentage. For example, the lowest portion of epitaxy layer L22 may have the highest boron concentration and highest germanium atomic percentage. With the proceeding of the epitaxy of epitaxy layer L22, the boron concentration and germanium atomic percentage reduce gradually, and the highest portion of epitaxy layer L22 may have the lowest boron concentration and lowest germanium atomic percentage.

Conversely, the highest portion of epitaxy layer L22 may have the highest boron concentration and highest germanium atomic percentage, while the lowest portion of epitaxy layer L22 may have the lowest boron concentration and lowest germanium atomic percentage. Accordingly, in the formation of contact opening (FIG. 12) the highest portion of epitaxy layer L22 acts as an effective etch stop layer to hamper the etching of epitaxy layer L22.

The thickness T6 of the top portion of epitaxy layer L22 is great enough so that after the subsequent contact opening formation, a layer of epitaxy layer L22 is left. Furthermore, it is also desirable that after the subsequent silicidation process, there is a portion of epitaxy layer L22 remaining to separate the resulting silicide region from epitaxy layer L21. In accordance with some embodiments, thickness T6 is greater than about 10 nm, and may be in the range between about 10 nm and about 20 nm.

In accordance with some embodiments, epitaxy layer L22 is the topmost (and outmost) layer of epitaxy region 68. In accordance with alternative embodiments, epitaxy layer L3 is also formed. Epitaxy layer L3 may have a germanium atomic percentage lower than that of L22 but higher than that of L21 and a boron atomic percentage higher than epitaxy layer L22, and may have a higher germanium atomic percentage than epitaxy layer L1. In accordance with some embodiments, the boron concentration in epitaxy layer L3 may be in the range between about $1 \times 1021/cm^3$ and about $2 \times 1021/cm^3$. The germanium atomic percentage in epitaxy layers L3 may be in the range between about 45 percent and about 55 percent in accordance with some embodiments. Epitaxy layer L3 may also have a low germanium atomic percentage lower than about 45 percent, and may be formed of SiB (free from germanium).

Figure 11:
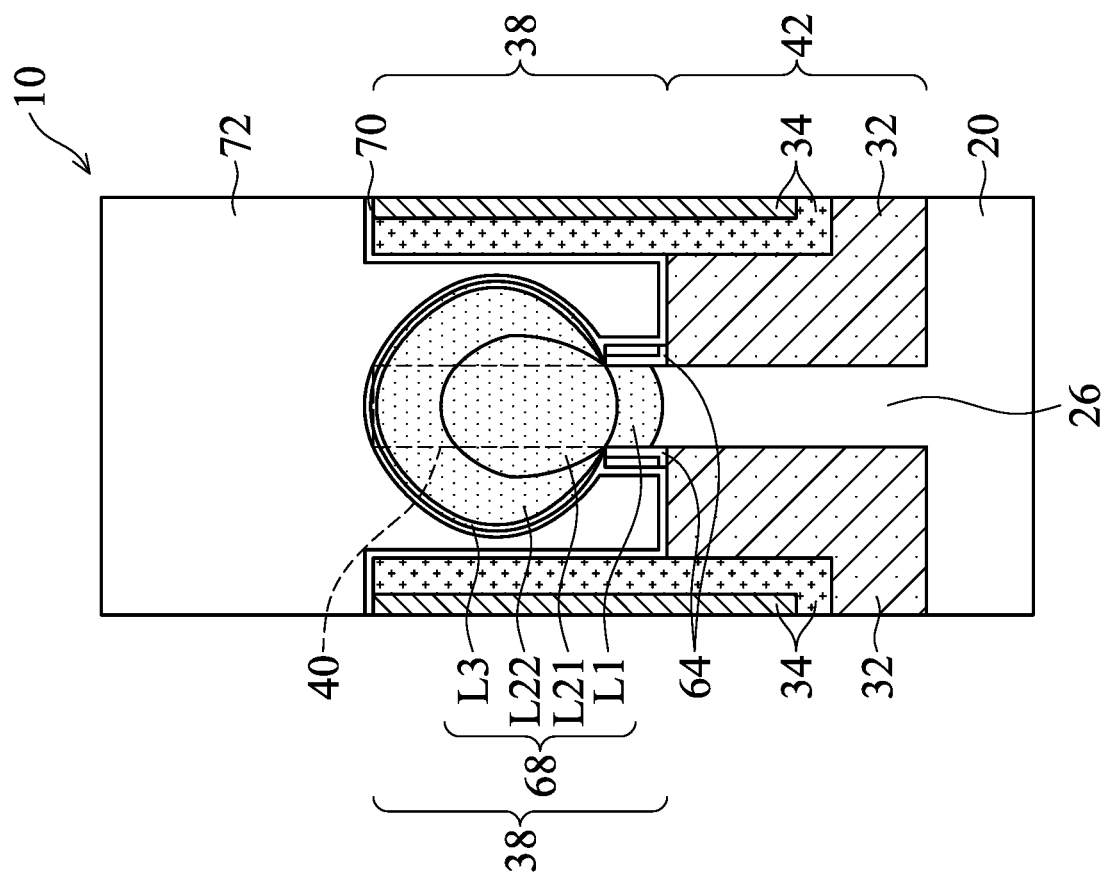

Next, referring to FIG. 11, Contact etch stop layer (CESL) 70 and Inter-Layer Dielectric (ILD) 72 are formed over epitaxy region 68, and over dummy gate stacks 52 (FIGS. 7A and 8A). The respective process is illustrated as process 222 in the process flow 200 as shown in FIG. 20. A planarization process such as a CMP process or a mechanical grinding process is performed to remove excess portions of CESL 70 and ILD 72, until dummy gate stacks 52 (FIG. 8A) are exposed.

In a subsequent process, the dummy gate stacks 52 (FIG. 8A) is replaced with a replacement gate stack (not shown), which may include an interfacial layer (such as a silicon oxide layer), a high-k dielectric layer over the interfacial layer, one or more work-function layers, a capping layer, and a filling metal region, or the like. In accordance with alternative embodiments, dummy gate stacks 52 are not replaced, and act as the actual gate of the resulting FinFET.

Next, referring to FIG. 12, ILD 72 and CESL 70 are etched to form source/drain contact opening 74. The respective process is illustrated as process 224 in the process flow 200 as shown in FIG. 20. In accordance with some embodiments in which epitaxy layer L3 is formed, epitaxy layer L3 is etched-through, and the top surfaces of epitaxy layer L22 is exposed. The etching is controlled to stop in epitaxy layer L22, with the over-etching of epitaxy layer L22 being small. For example, source/drain contact opening 74 may extend into epitaxy layer L22 for a depth in the range between about 1 nm and about 3 nm.

The reduced over-etching of epitaxy layer L22 is achieved due to the increased boron concentration and/or increased germanium atomic percentage. For example, in the cleaning process for forming source/drain contact opening 74, chemicals such as de-ionized water and ozone ($O_3$) may be used, which oxidize the epitaxy region 68, and the resulting oxide is removed, which become parts of the etching of epitaxy layer L22. When boron concentration and/or germanium atomic percentage are increased, the etching rate is reduced. Accordingly, epitaxy layer L22 acts as an etch (cleaning) stop layer. It is desirable that epitaxy layer L22 is not etched-through, and has an adequate remaining layer left underlying source/drain contact opening 74. Otherwise, if epitaxy layer L22 is etched-through, since epitaxy layer L21 has lower boron concentration and/or lower germanium atomic percentage than epitaxy layer L22, the etching rate of epitaxy layer L21 will be high and not controllable. This will cause a significant portion of L21 to be removed, and the loss of the boron in the etched portion of L21 is significant. Furthermore, by providing an upper sub-layer or a lower sub-layer with a boron concentration and/or germanium atomic percentage even higher than the remaining portions, an effective etch stop layer is provided.

Figure 13:
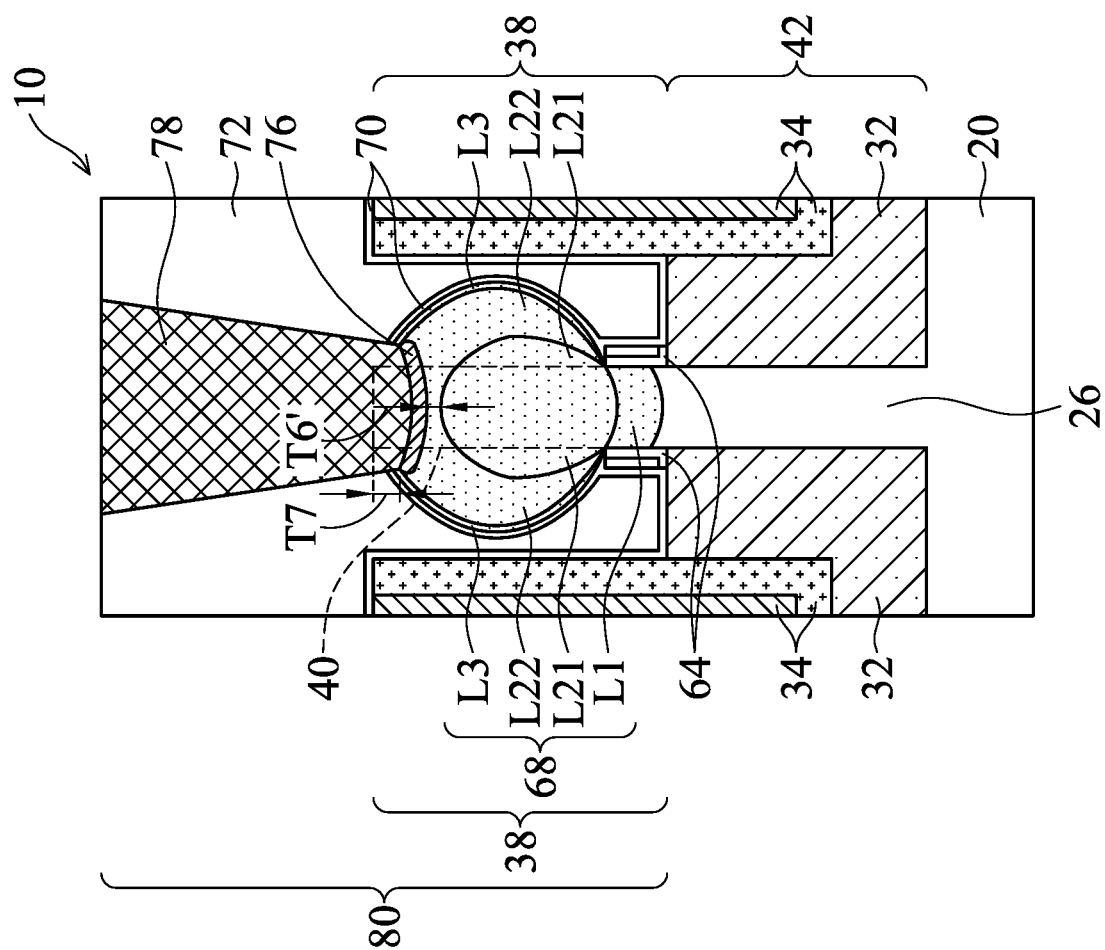

Next, as shown in FIG. 13, source/drain silicide region 76 is formed. The respective process is illustrated as process 226 in the process flow 200 as shown in FIG. 20. In accordance with some embodiments of the present disclosure, the formation of the source/drain silicide region 76 includes depositing a metal layer such as a titanium layer, a cobalt layer, or the like, which extend into opening 74 (FIG. 12), and then performing an annealing process so that the bottom portions of the metal layer react with epitaxy layer L22 to form the silicide region 76. The remaining un-reacted metal layer may be removed. Source/drain contact plug 78 is then formed, and is electrically connected to source/drain silicide region 76. The respective process is illustrated as process 228 in the process flow 200 as shown in FIG. 20. In accordance with some embodiments, source/drain contact plug 78 comprises a TiN layer, and a filling metal (such as tungsten or cobalt) over the TiN layer. FinFET 80 is thus formed.

The silicidation process also consumes some portion of epitaxy layer L22. It is desirable that after the silicidation process, there is still a portion of epitaxy layer L22 (with thickness T6') remaining to separate source/drain silicide region 76 from epitaxy layer L21. The value of thickness T6' cannot be too high or too small. If the value of T6' is too small, due to process variation, the source/drain silicide regions 76 of some of the FinFETs in the respective die may contact epitaxy layer L21, and the device performance will be degraded. If the value of thickness T6' is too high, the thickness of epitaxy layer L21 will have to be reduced to allow room for the increased thickness of epitaxy layer L22. As a result, epitaxy layer L21 will be too small, and the shape of epitaxy region 68 will be changed accordingly. This eventually causes silicide region 76 to land at a lower level than desired. Accordingly, the thickness T6' of remaining epitaxy layer L22 may be selected to be in the range between about 3 nm and about 10 nm.

Similar to the thickness T6', the distance T7 from source/drain silicide region 76 to the top of protruding fin 40 also cannot be too large or too small. Otherwise, the consequence will be similar to that thickness T6' is too small or too large, respectively. Accordingly, the distance T7 may be selected to be in a range between about 10 nm and about 15 nm.

The FinFET 80 as shown in FIG. 13 is formed based on a single protruding semiconductor fin 40. In accordance with alternative embodiments, multi-fin FinFETs may be formed, as shown in FIGS. 14 through 18. Unless specified otherwise, the materials and the formation processes of the components in these embodiments are essentially the same as the like components, which are denoted by like reference numerals in the preceding embodiments. The details regarding the formation process and the materials of the components shown in FIGS. 14-18 may thus be found in the discussion of the preceding embodiments.

Figure 14:
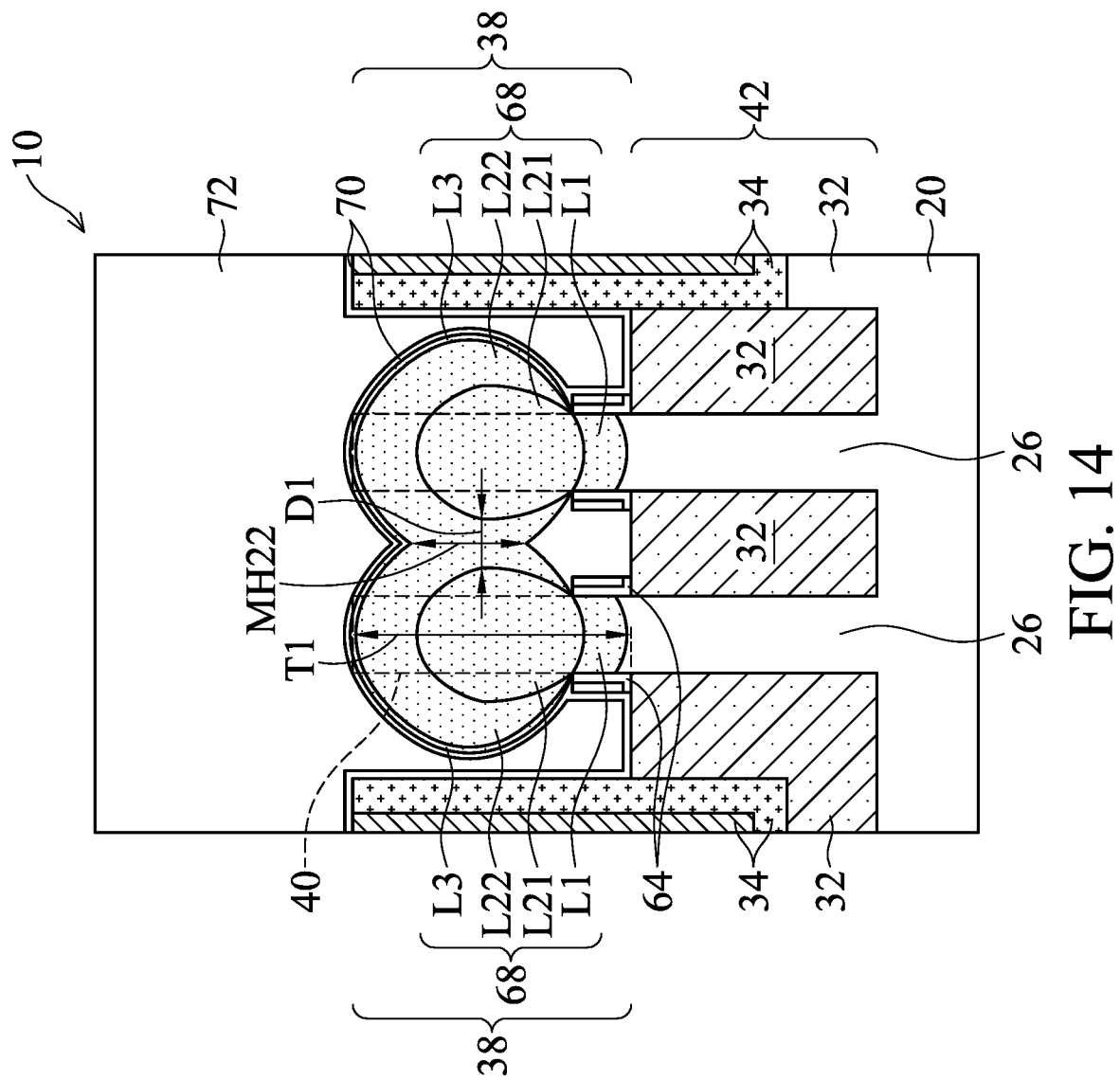
FIGS. 14 and 15 illustrate the cross-sectional views of intermediate stages in the formation of a FinFET based on two protruding semiconductor fins in accordance with some embodiments.

Referring to FIG. 14, epitaxy region 68 is formed. The initial steps of these embodiments are essentially the same as shown in FIGS. 1-5, 6A, 6B, 7A, 7B, 8A, 8B, and 9, except that in FIG. 14, two or more protruding semiconductor fins 40 are neighboring each other without dummy fins 38 in between. The formation processes are also similar to the preceding embodiments, except that the protruding semiconductor fins 40 are close to each other, and after the formation of dielectric layer 32, no dielectric layer 34 can be filled between the closely located protruding semiconductor fins 40. Accordingly, no dummy fin 38 will be formed between the closely located protruding semiconductor fins 40.

FIG. 14 illustrates the formation of epitaxy region 68 from two (or more) protruding semiconductor fins 40 in accordance with some embodiments, wherein epitaxy layers L21 grown based on different ones of protruding semiconductor fins 40 are not merged. Epitaxy layers L1, L21, L22, and L3 (which may be or may not be formed) are shown. The epitaxy layers L21 are not merged. Instead, the epitaxy layers L22 grown based on neighboring protruding semiconductor fins 40 are merged.

In accordance with these embodiments, to ensure epitaxy layers L21 to be large enough but not excessive, and that the overlying epitaxy layer L22 has adequate thickness so that epitaxy layer L22 is not etched-through, the dimensions of epitaxy layers L21 and L22 are controlled. The distance D1 between neighboring epitaxy layers L21 may be selected to be in the range between about 3 nm and about 10 nm. This allows enough room for the merging of epitaxy layers L22 before the top of epitaxy layer 22 reaches the top surface level of protruding semiconductor fins 40.

In accordance with these embodiments, the merging height MH22 of epitaxy layer L22 is selected to be in the range between about 15 nm and about 20 nm. The merging height MH22 may also be in the range between about 20 percent and about 30 percent of fin height T1 (so that ratio MH22/T1 is in the range between 0.2 and about 0.3). If merging height MH22 is smaller than about 15 nm, and/or ratio MH22/T1 is smaller than about 0.2, epitaxy layer L22 may be too thin, and may be etched-through in subsequent processes, causing boron loss. If the merging height MH22 is greater than about 20 nm, and/or ratio MH22/T1 is greater than about 0.3, the subsequently formed contact plug will land at a too-high level, and there may be short circuit issue.

Figure 15:
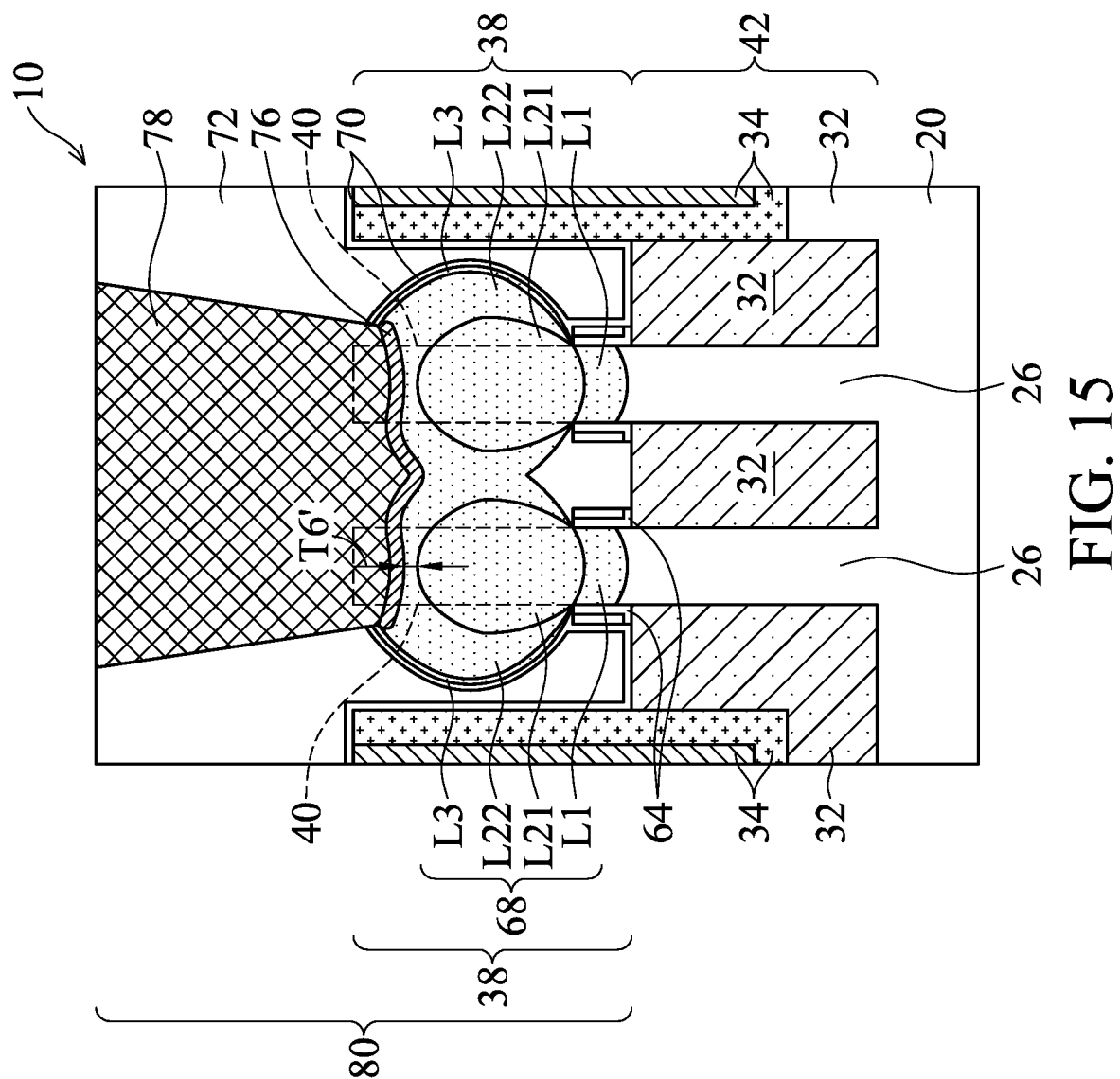

FIG. 15 illustrates the formation of contact plug 78 and silicide region 76. Silicide region 76 is formed above, and is spaced apart from epitaxy regions L21. The thickness T6' may be in the range between about 3 nm and about 10 nm.

Figure 16:
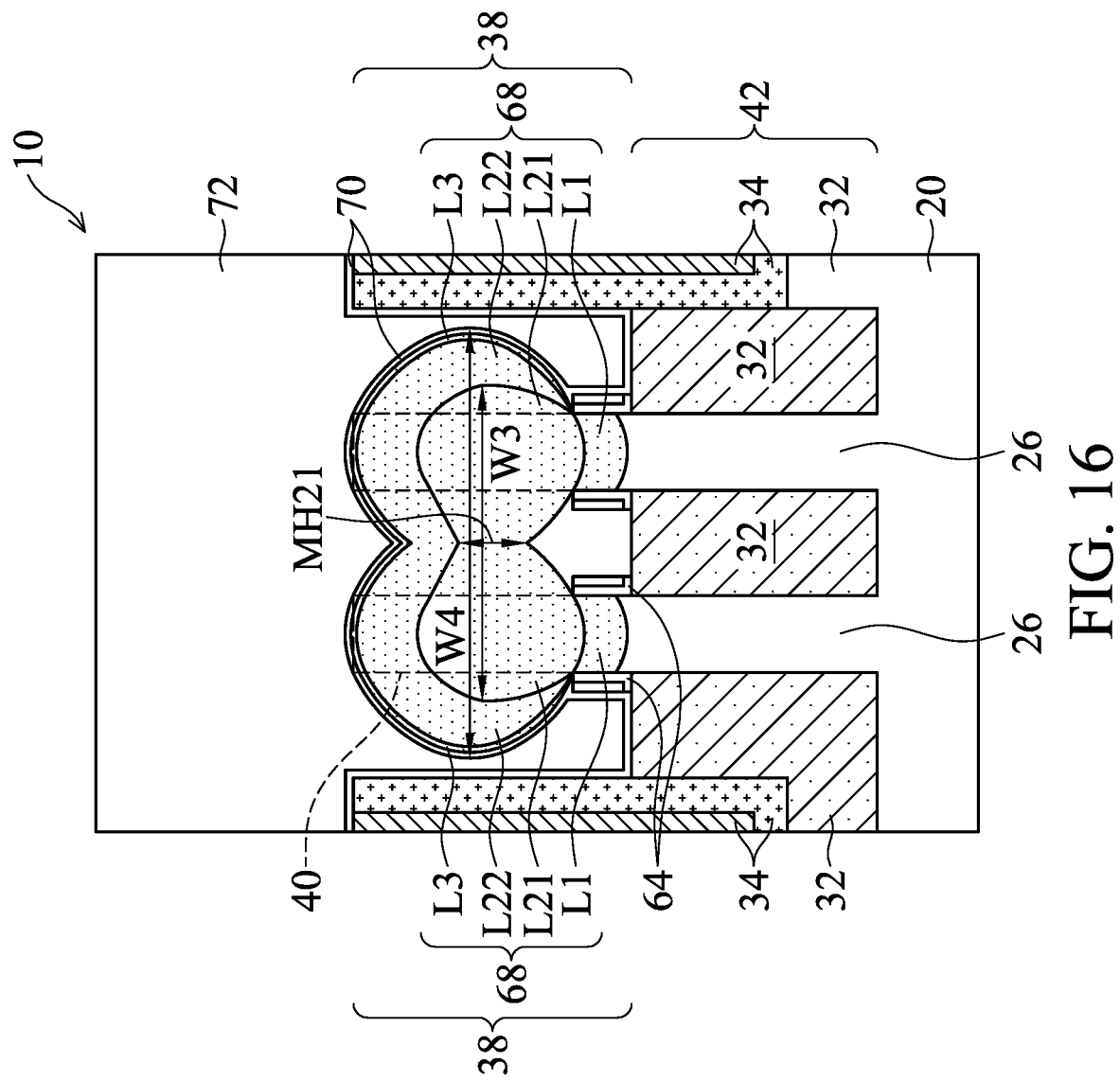
FIGS. 16 and 17 illustrate the cross-sectional views of intermediate stages in the formation of a FinFET based on two protruding semiconductor fins in accordance with some embodiments.
Figure 17:
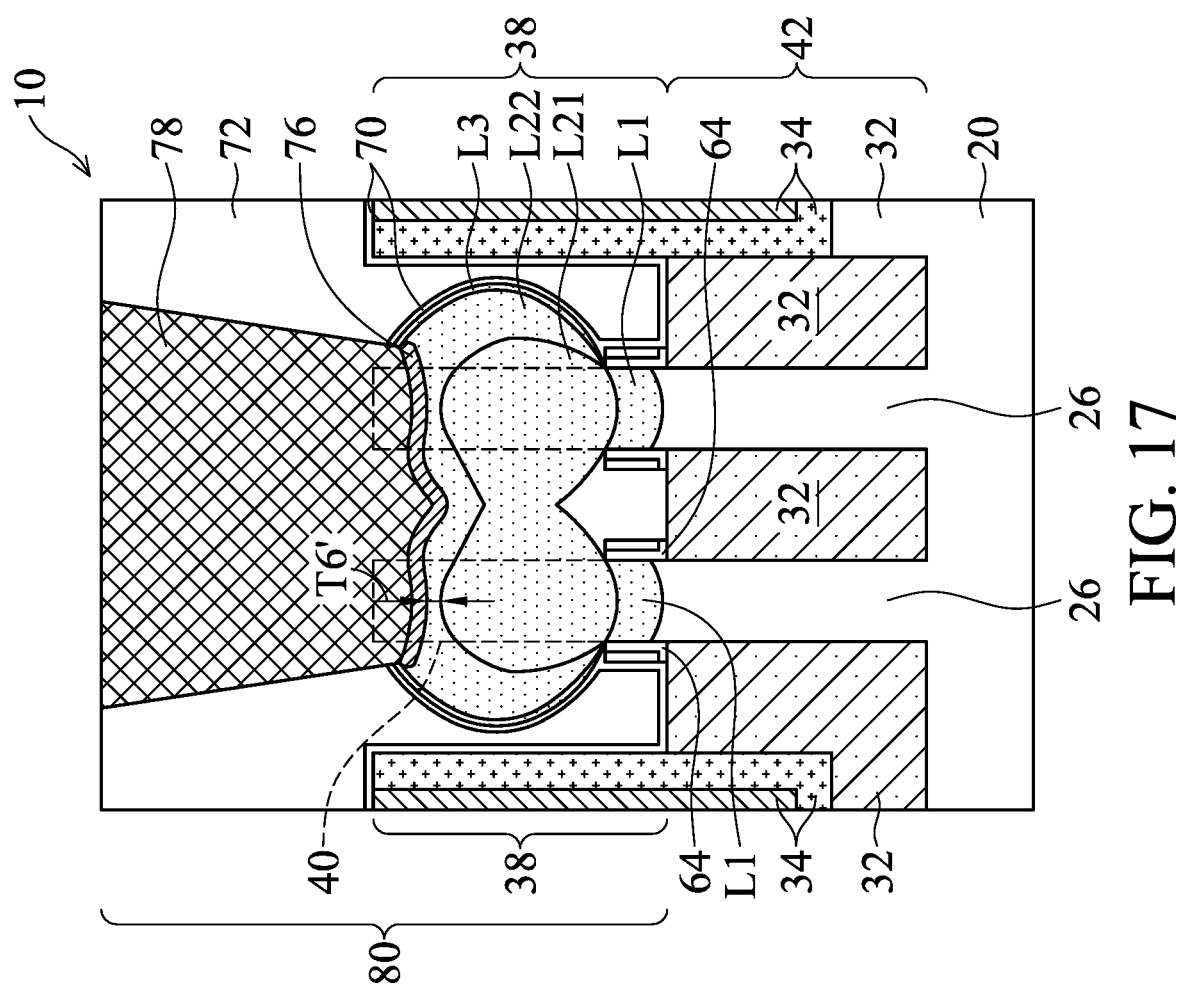

FIGS. 16 and 17 illustrate the formation a multi-fin FinFET in accordance with alternative embodiments. These embodiments are similar to the embodiments as shown in FIGS. 14 and 15, except that layers L21 are merged, and layer L22 is formed on the merged layer L21.

In accordance with these embodiments, the merging height MH21 of epitaxy layer L21 is selected to be in the range between about 15 nm and about 20 nm. The merging height MH21 may be smaller than about 30 percent of fin height T1. The merging height MH21 may also be smaller than about 30 nm. If the merging height MH21 is greater than about 30 percent of fin height T1, and/or greater than about 30 nm, the overall shape of epitaxy layers L21 and L22 will be changed undesirably, and the subsequently formed contact plug 78 will land at a too-high level, and there may be short circuit issue. A ratio T1/MH21 may be in the range between about 3 and about 8.

The width W4 of the epitaxy region 68 may be in the range between about 40 nm and about 60 nm. The width W3 of the merged epitaxy layer L21 may be in the range between about 35 nm and about 45 nm, and may be in the range between about 60 percent and about 90 percent of width W4. If width W3 is smaller than about 35 nm, it may be smaller than fin pitch, and the merging of epitaxy layers L21 may not occur. If width W3 is greater than about 45 nm, the total volume of epitaxy layers L21 and L22 may be too small, and the portions of epitaxy layers L21 and L22 grown from neighboring protruding semiconductor fins 40 may not be merged as one single region. Similarly, if width W3 is greater than about 60 nm, it may occupy too much space and may cause the merging of epitaxy regions of neighboring FinFETs.

FIG. 17 illustrates the formation of contact plug 78 and silicide region 76. Silicide region 76 is formed above, and is spaced apart from the merged epitaxy region L21. The thickness T6' may be in the range between about 3 nm and about 10 nm.

Figure 18:
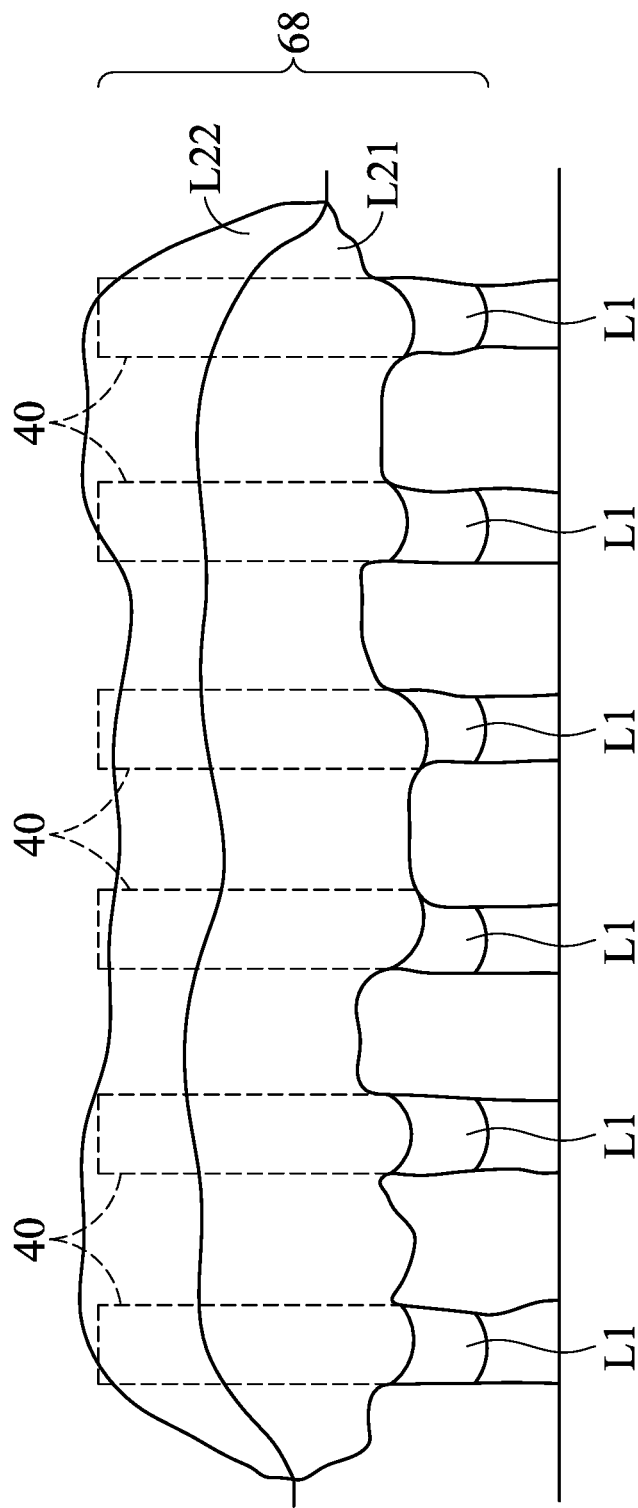
FIG. 18 illustrates the cross-sectional view of an epitaxy region based on multiple protruding semiconductor fins in accordance with some embodiments.

FIG. 18 schematically illustrates an epitaxy region 68 formed based on a plurality of protruding semiconductor fins 40. In accordance with some embodiments, the epitaxy layers L21 based on multiple protruding semiconductor fins 40 are merged.

Figure 19:
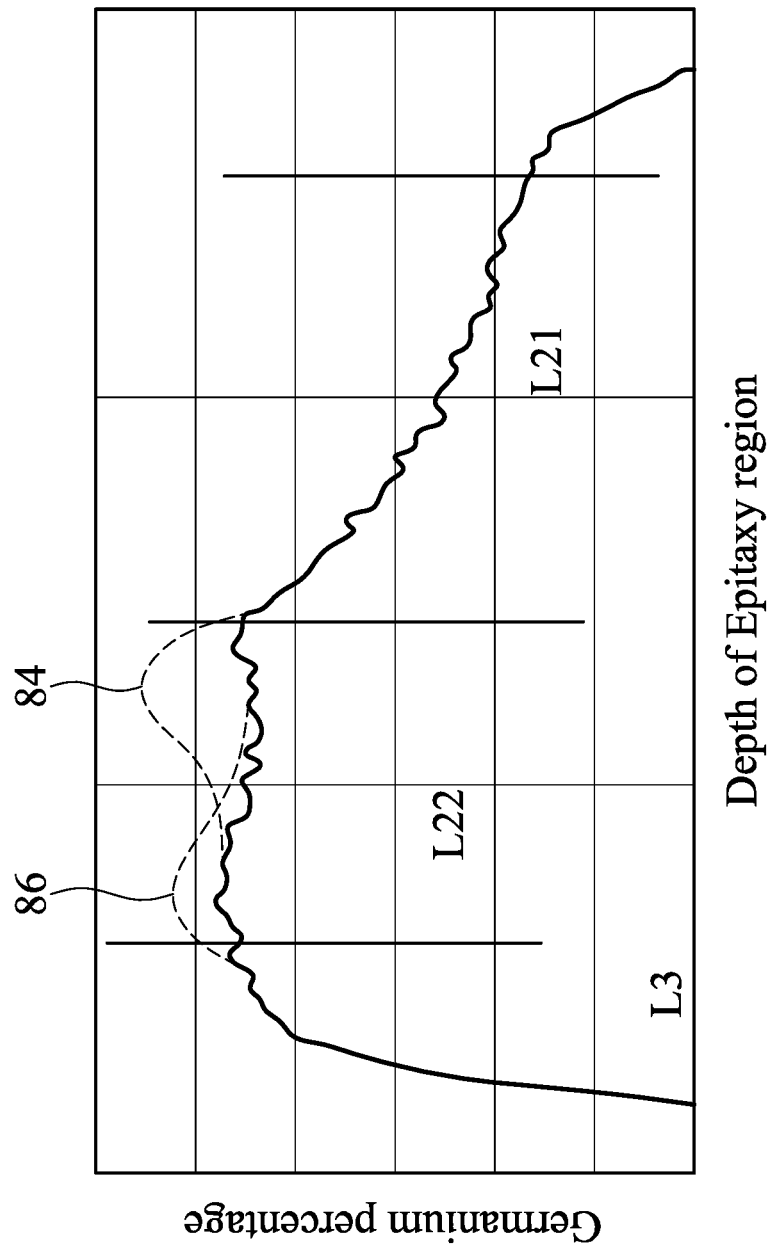
FIG. 19 illustrates the germanium or boron distribution in a source/drain epitaxy region in accordance with some embodiments.

FIG. 19 schematically illustrates the distribution of boron in an epitaxy region 68 in accordance with some embodiments. After the deposition of epitaxy region 68, there are a plurality of thermal processes, which causes the diffusion of germanium. Layers L1, L21, L22, and L3 are marked. Dashed line 84 schematically illustrates the germanium distribution wherein the bottom portion of epitaxy layer L22 has the highest boron concentration, and dashed line 86 schematically illustrates the germanium distribution wherein the top portion of epitaxy layer L22 has the highest boron concentration. Boron distribution may have the similar trend, and may also be schematically illustrate using FIG. 19.

The embodiments of the present disclosure have some advantageous features. By selecting proper boron concentration, germanium percentage, and the positions and thicknesses of epitaxy layers, source/drain contact plugs and silicide regions may land on (and stopped in) an epitaxy layer with a high dopant concentration and a germanium concentration. The dopant loss problem is thus avoided. Furthermore, the strain of the epitaxy regions is kept high due to the reduced loss of the epitaxy regions. The currents of the FinFETs are increased. Furthermore, due to better contact landing and the well-positioned highly-doped layer, parasitic capacitance may be reduced. Experiment results through Transmission electron microscopy (TEM) nano-beam diffraction measurement revealed that by using the embodiments of the present disclosure, the strain in source/drain regions may be improved by about 0.4 percent comparing to conventional structures, in which contact plugs and silicide regions extend into L21 layers.

In accordance with some embodiments of the present disclosure, a method includes forming a protruding semiconductor fin protruding higher than isolation regions; forming a gate stack on a first portion of the protruding semiconductor fin; recessing a second portion of the protruding semiconductor fin to form a recess between fin spacers; forming an epitaxy region from the recess, wherein the forming the epitaxy region comprises growing a first epitaxy layer having a first doping concentration; growing a second epitaxy layer over the first epitaxy layer, wherein the second epitaxy layer has a second doping concentration higher than the first doping concentration; forming an inter-layer dielectric over the epitaxy region; and recessing the inter-layer dielectric to form a contact opening, wherein after the recessing, the first epitaxy layer is separated from the contact opening by a remaining portion of the second epitaxy layer. In an embodiment, the first doping concentration and the second doping concentration are concentrations of boron. In an embodiment, the first epitaxy layer and the second epitaxy layer comprise silicon germanium, and wherein the second epitaxy layer has a higher germanium atomic percentage than the first epitaxy layer. In an embodiment, the forming the epitaxy region further comprises growing a semiconductor capping layer over the second epitaxy layer, wherein the semiconductor capping layer has a first germanium atomic percentage lower than a second germanium atomic percentage of the second epitaxy layer. In an embodiment, the method further comprises forming a silicide region at a bottom of the contact opening and at a top surface of the epitaxy region, wherein the silicide region is spaced apart from the first epitaxy layer by a part of the remaining portion of the second epitaxy layer. In an embodiment, the growing the second epitaxy layer comprises growing a first sub-layer; and growing a second sub-layer over the first sub-layer, wherein the first sub-layer has a greater doping concentration than the second sub-layer, and wherein both of the first sub-layer and the second sub-layer have greater doping concentrations than the first epitaxy layer. In an embodiment, the remaining portion of the second epitaxy layer comprises the first sub-layer. In an embodiment, the growing the second epitaxy layer comprises growing a first sub-layer; and growing a second sub-layer over the first sub-layer, wherein the first sub-layer has a lower doping concentration than the second sub-layer, and wherein both of the first sub-layer and the second sub-layer have greater doping concentrations than the first epitaxy layer. In an embodiment, the remaining portion of the second epitaxy layer comprises both of the first sub-layer and the second sub-layer. In an embodiment, at a time the epitaxy region has been formed and before the inter-layer dielectric is formed, a topmost point of the first epitaxy layer is lower than a top level of the protruding semiconductor fin. In an embodiment, the method further comprises forming dummy dielectric fins on opposite sides of the protruding semiconductor fin, wherein a topmost end of the epitaxy region is at substantially a same level as the protruding semiconductor fin and the dummy dielectric fins.

In accordance with some embodiments of the present disclosure, a device includes a protruding semiconductor fin; a gate stack on the protruding semiconductor fin; an epitaxy region connected to an end of the protruding semiconductor fin, wherein the epitaxy region comprises a first epitaxy layer having a first doping concentration; a second epitaxy layer over the first epitaxy layer, wherein the second epitaxy layer has a second doping concentration higher than the first doping concentration; a contact etch stop layer over the epitaxy region; an inter-layer dielectric over the contact etch stop layer; and a contact plug penetrating through the contact etch stop layer and the inter-layer dielectric, wherein the contact plug is spaced apart from the first epitaxy layer by a bottom portion of the second epitaxy layer. In an embodiment, the device further comprises a silicide region extending into the second epitaxy layer, wherein the silicide region is spaced apart from the first epitaxy layer by the bottom portion of the second epitaxy layer. In an embodiment, the bottom portion of the second epitaxy layer has a thickness in a range between about 3 nm and about 10 nm. In an embodiment, the device further comprises a semiconductor capping layer over the second epitaxy layer, wherein the semiconductor capping layer has a first germanium atomic percentage lower than a second germanium atomic percentage of the second epitaxy layer. In an embodiment, the device further comprises a third epitaxy layer underlying the first epitaxy layer; and fin spacers contacting opposing sidewalls of the third epitaxy layer, wherein the third epitaxy layer has a third doping concentration lower than the first doping concentration. In an embodiment, the first epitaxy layer and the second epitaxy layer comprise silicon germanium, and wherein the second epitaxy layer has a higher germanium atomic percentage than the first epitaxy layer.

In accordance with some embodiments of the present disclosure, a device includes isolation regions; a first protruding semiconductor fin and a second protruding semiconductor fin neighboring each other and protruding over the isolation regions; a gate stack on the first protruding semiconductor fin and the second protruding semiconductor fin; fin spacers overlapping the isolation regions; a first epitaxy layer and a second epitaxy layer, both extending higher than the fin spacers, wherein the first epitaxy layer and the second epitaxy layer comprise boron-doped silicon germanium; a third epitaxy layer over the first epitaxy layer and the second epitaxy layer, wherein the third epitaxy layer has a higher boron concentration and a higher germanium atomic percentage than both of the first epitaxy layer and the second epitaxy layer; and a source/drain silicide region extending into the third epitaxy layer, wherein the source/drain silicide region contacts a top surface of the third epitaxy layer. In an embodiment, the first epitaxy layer is merged with the second epitaxy layer, with a merging height being smaller than about 30 percent of a fin height of the first protruding semiconductor fin. In an embodiment, the first epitaxy layer is separated from the second epitaxy layer, and the third epitaxy layer connects the first epitaxy layer to the second epitaxy layer, and wherein the third epitaxy layer has a merging height being in a range between about 20 percent and about 30 percent of a fin height of the first protruding semiconductor fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a protruding semiconductor fin protruding higher than isolation regions;
   forming a gate stack on a first portion of the protruding semiconductor fin;
   recessing a second portion of the protruding semiconductor fin to form a recess between fin spacers;
   forming an epitaxy region from the recess, wherein the forming the epitaxy region comprises:
      growing a first epitaxy layer having a first doping concentration;
      growing a second epitaxy layer over the first epitaxy layer, wherein the growing the second epitaxy layer comprises:
         growing a first sub-layer; and
         growing a second sub-layer over the first sub-layer, wherein the first sub-layer has a greater or a lower doping concentration than the second sub-layer, and wherein both of the first sub-layer and the second sub-layer have greater doping concentrations than the first epitaxy layer;
   forming an inter-layer dielectric over the epitaxy region; and
   recessing the inter-layer dielectric to form a contact opening, wherein after the recessing, the first epitaxy layer is separated from the contact opening by a remaining portion of the second epitaxy layer.

2. The method of claim 1, wherein the first doping concentration and doping concentrations of the first sub-layer and the second sub-layer are concentrations of boron.

3. The method of claim 1, wherein the first epitaxy layer and the second epitaxy layer comprise silicon germanium, and wherein the second epitaxy layer has a higher germanium atomic percentage than the first epitaxy layer.

4. The method of claim 3, wherein the forming the epitaxy region further comprises growing a semiconductor capping layer over the second epitaxy layer, wherein the semiconductor capping layer has a first germanium atomic percentage lower than a second germanium atomic percentage of the second epitaxy layer.

5. The method of claim 1 further comprising forming a silicide region at a bottom of the contact opening and at a top surface of the epitaxy region, wherein the silicide region is spaced apart from the first epitaxy layer by a part of the remaining portion of the second epitaxy layer.

6. The method of claim 1, wherein the first sub-layer has a greater doping concentration than the second sub-layer.

7. The method of claim 6, wherein the remaining portion of the second epitaxy layer comprises the first sub-layer.

8. The method of claim 1, wherein the first sub-layer has a lower doping concentration than the second sub-layer.

9. The method of claim 8, wherein the remaining portion of the second epitaxy layer comprises both of the first sub-layer and the second sub-layer.

10. The method of claim 1, wherein at a time the epitaxy region has been formed and before the inter-layer dielectric is formed, a topmost point of the first epitaxy layer is lower than a top level of the protruding semiconductor fin.

11. The method of claim 1 further comprising:
    forming dummy dielectric fins on opposite sides of the protruding semiconductor fin, wherein a topmost end of the epitaxy region is at substantially a same level as the protruding semiconductor fin and the dummy dielectric fins.

12. A method comprising:
    forming an epitaxy region connected to an end of a protruding semiconductor fin, wherein forming the epitaxy region comprises:
       depositing a first epitaxy layer having a first doping concentration; and
       depositing a second epitaxy layer over the first epitaxy layer, wherein the second epitaxy layer comprises:
          a lower portion; and
          an upper portion over the lower portion, wherein the lower portion and the upper portion have second doping concentrations that are different from each other, and wherein the second doping concentrations are higher than the first doping concentration;
    depositing a contact etch stop layer over the epitaxy region;
    depositing an inter-layer dielectric over the contact etch stop layer; and
    forming a contact plug penetrating through the contact etch stop layer and the inter-layer dielectric, wherein the contact plug is spaced apart from the first epitaxy layer by a bottom portion of the second epitaxy layer.

13. The method of claim 12 further comprising:
    forming a silicide region extending into the second epitaxy layer, wherein the silicide region is spaced apart from the first epitaxy layer by the bottom portion of the second epitaxy layer.

14. The method of claim 12, wherein the bottom portion of the second epitaxy layer has a thickness in a range between about 3 nm and about 10 nm.

15. The method of claim 12 further comprising depositing a semiconductor capping layer over the second epitaxy layer, wherein the semiconductor capping layer has a first germanium atomic percentage lower than a second germanium atomic percentage of the second epitaxy layer.

16. The method of claim 12 further comprising:
    depositing a third epitaxy layer underlying the first epitaxy layer and between fin spacers, wherein the third epitaxy layer has a third doping concentration lower than the first doping concentration.

17. The method of claim 12, wherein the first epitaxy layer and the second epitaxy layer are deposited as comprising silicon germanium, and wherein the second epitaxy layer has a higher germanium atomic percentage than the first epitaxy layer.

18. A method comprising: forming a first protruding semiconductor fin and a second protruding semiconductor fin neighboring each other, wherein the first protruding semiconductor fin and the second protruding semiconductor fin are higher than isolation regions, and are over and joined to a first semiconductor strip and a second semiconductor strip, respectively; forming a gate stack on the first protruding semiconductor fin and the second protruding semiconductor fin; forming fin spacers overlapping the isolation regions; epitaxially growing a first epitaxy layer and a second epitaxy layer from the first semiconductor strip and the second semiconductor strip, respectively, wherein the second epitaxy layer is higher than the fin spacers; epitaxially growing a third epitaxy layer over and physically contacting the first epitaxy layer and the second epitaxy layer, wherein the third epitaxy layer has a higher boron concentration and a higher germanium atomic percentage than both of the first epitaxy layer and the second epitaxy layer; growing a fourth epitaxy layer from the third epitaxy layer, wherein a germanium atomic percentage of the fourth epitaxy layer is higher than the first epitaxy layer and the second epitaxy layer, and lower than the third epitaxy layer; and forming a source/drain silicide region extending into the third epitaxy layer, wherein the source/drain silicide region contacts a top surface of the third epitaxy layer.

19. The method of claim 18, wherein the third epitaxy layer comprises a first part grown from the first epitaxy layer, and a second part grown from the second epitaxy layer, and wherein the first part is merged with the second part.

20. The method of claim 18, wherein the first epitaxy layer and the second epitaxy layer are formed in a recess that is between two dielectric fins.

* * * * *